United States Patent
Tanaka et al.

(10) Patent No.: US 8,313,831 B2
(45) Date of Patent: Nov. 20, 2012

(54) THERMOPLASTIC POLYIMIDE RESIN FILM, MULTILAYER BODY AND METHOD FOR MANUFACTURING PRINTED WIRING BOARD COMPOSED OF SAME

(75) Inventors: Shigeru Tanaka, Settsu (JP); Takashi Itoh, Otsu (JP); Masaru Nishinaka, Otsu (JP); Kanji Shimo-Ohsako, Settsu (JP); Mutsuaki Murakami, Settsu (JP)

(73) Assignee: Kaneka Corporation, Osaka-shi, Osaka (JP)

( * ) Notice: Subject to any disclaimer, the term of this patent is extended or adjusted under 35 U.S.C. 154(b) by 1080 days.

(21) Appl. No.: 10/537,959

(22) PCT Filed: Dec. 12, 2003

(86) PCT No.: PCT/JP03/15928
§ 371 (c)(1),
(2), (4) Date: Jun. 7, 2005

(87) PCT Pub. No.: WO2004/055110
PCT Pub. Date: Jul. 1, 2004

(65) Prior Publication Data
US 2006/0115670 A1 Jun. 1, 2006

(30) Foreign Application Priority Data

Dec. 13, 2002 (JP) .................. 2002-362485
Mar. 14, 2003 (JP) .................. 2003-70696
Mar. 14, 2003 (JP) .................. 2003-71058

(51) Int. Cl.
*B32B 27/00* (2006.01)
(52) U.S. Cl. ....... 428/319.3; 29/846; 174/259; 428/209; 528/310
(58) Field of Classification Search .................. 428/319, 428/336, 141, 195, 341, 447, 319.3, 209; 528/310; 174/259; 29/846
See application file for complete search history.

(56) References Cited

U.S. PATENT DOCUMENTS

| | | | |
|---|---|---|---|
| 4,742,099 A | 5/1988 | Nagano et al. | |
| 4,806,422 A * | 2/1989 | Ohno et al. | 428/32.67 |
| 5,130,192 A | 7/1992 | Takabayashi et al. | |
| 6,286,207 B1 * | 9/2001 | Oura et al. | 29/846 |
| 6,461,722 B1 * | 10/2002 | Kittel et al. | 428/32.51 |
| 2001/0013425 A1 * | 8/2001 | Rokugawa et al. | 174/262 |
| 2002/0054991 A1 * | 5/2002 | Shibuya et al. | 428/319.3 |
| 2003/0049487 A1 * | 3/2003 | Katsuki et al. | 428/626 |
| 2003/0170431 A1 * | 9/2003 | Oguni et al. | 428/209 |

FOREIGN PATENT DOCUMENTS

| | | |
|---|---|---|
| JP | 06-073209 | 3/1994 |
| JP | 08-230103 | 9/1996 |
| JP | 11-026933 | 1/1999 |
| JP | 11-071474 | 3/1999 |
| JP | 2000-017444 | 1/2000 |
| JP | 2000-198907 | 7/2000 |
| JP | 2001-332864 | 11/2001 |
| JP | 2002-113812 | 4/2002 |
| JP | 2002-192651 | 7/2002 |
| JP | 2002-307608 | 10/2002 |

* cited by examiner

*Primary Examiner* — Gregory Listvoyb
(74) *Attorney, Agent, or Firm* — Westerman, Hattori, Daniels & Adrian, LLP

(57) ABSTRACT

The present invention provides a laminate having a two-layer or three-layer structure including a non-thermoplastic polyimide film and a thermoplastic polyimide layer provided on one or both of the surfaces thereof, the surface of the thermoplastic polyimide layer being surface-treated; a laminate including a polymer film and a layer provided on one or both of the surfaces thereof, the layer including a polyimide resin composition comprising a polyimide resin with a specified structure and a thermosetting component; and a resin film and a laminate including the same which provided one, at least, of surface having a Ra1 value of arithmetic mean roughness of 0.05 μm to 1 μm measured with a cutoff value of 0.002 mm, and a Ra1/Ra2 ratio of 0.4 to 1, Ra2 being a value measured with a cutoff value of 0.1 mm. These laminates can provide a printed circuit board with excellent adhesiveness, on which a micro-wiring circuit can be formed.

4 Claims, 1 Drawing Sheet

THERMOPLASTIC POLYIMIDE RESIN FILM, MULTILAYER BODY AND METHOD FOR MANUFACTURING PRINTED WIRING BOARD COMPOSED OF SAME

RELATED APPLICATION

This application is a nationalization of PCT application PCT/JP2003/015928 filed Dec. 12, 2003 claiming priorities based on Japanese Application No. 2002-362485 filed on Dec. 13, 2002, Japanese Application No. 2003-70696 filed on Mar. 14, 2003, and Japanese Application No. 2003-71058 filed on Mar. 14, 2003, the content of which are incorporated herein by reference in their entirety.

FIELD OF THE INVENTION

The present invention relates to materials composed of thermoplastic polyimide resins used for printed wiring boards which are widely used for electric and electronic apparatuses, and the like, thermoplastic polyimide resin films, laminates, and a method for manufacturing printed wiring boards composed of same.

DESCRIPTION OF THE RELATED ART

Recent years, electronic components used for electronic apparatuses have been required to have more downsized, higher processing speed, more lighter weight, higher density, higher reliability, and the like with respect to miniaturization and advancement of electronic apparatuses. Accordingly, a method for packaging semiconductor elements and wiring materials and wiring components for mounting semiconductor elements have been also required to have higher density, increasingly sophisticated function, and advanced performance. Therefore, recently, wiring boards have been multi-layered, and an additive method has been used as a method for forming semiconductor circuits. The additive method is suitable for forming hi-density patterns by means of forming a semiconductor circuits on a substrate by plating such as electroless plating or the like.

However, adhesiveness between a semiconductor circuit comprising a metal and a substrate comprising a resin composition has become a problem with further thinning of wiring on a wiring board.

In a method for improving adhesiveness between a plated metal and a substrate comprising a resin composition, a film-shaped adhesive which has a surface to be roughened in a range of arithmetic mean roughness Ra of 1 to 10 μm and be subjected to electroless plating is used to permit strong bonding between the metal and the resin with an adhesive strength of 10 N/cm or more at the metal-resin interface (refer to, for example, Japanese publication of patent application; Japanese Patent Laid-Open No. 11-26933 official report (published on Jan. 29, 1999). This method causes no problem when circuit wiring has a high ratio of wiring width/wiring space (referred to as "L/S" hereinafter), but the method is unsatisfactory for requirements of further thinning of wiring in future.

Also, circuits have been recently required to have higher density and smaller thickness with requirements for smaller electronic apparatuses with sophisticated function. In particular, establishment of a method for forming a microcircuit with a L/S of 25 μm/25 μm or less has become an important problem.

In a printed wiring board, adhesion between a polymer film used as a substrate and a circuit is generally achieved by surface roughness called an "anchor effect". Therefore, a step of roughening a surface of the film is generally provided for forming roughness of about 3 to 5 μm in terms of a Rz value on the surface of the substrate. Such surface roughness of the substrate is not a problem for the formed circuit having a L/S of 30 μm/30 μm or more, but the roughness is an important problem in forming a circuit having a line width with a L/S of 30 μm/30 μm or less, particularly 25 μm/25 μm or less. This is because such a microcircuit line with a high density is affected by the roughness of the substrate surface. Therefore, a technique for forming a circuit on a polymer substrate with high surface smoothness is required for forming a circuit with a L/S value of 25 μm/25 μm or less, and the smoothness must be 3 μm or less and preferably 1.5 μm or less in terms of a Rz value. In this case, however, the anchor effect cannot be expected as adhesive force, and thus improvement in adhesive strength cannot be expected. For example, a method of electroless plating on a roughened surface of an epoxy resin is disclosed as a method for roughening a resin surface (refer to, for example, Japanese publication of patent application Japanese Patent Laid-Open No. 2000-198907 official report (published on Jul. 18, 2000). However, with a surface roughness Rz of 3 μm or more, high adhesiveness can be achieved, while with a surface roughness Rz of 3 μm or less, particularly about 1 μm, an adhesiveness of only about 3 N/cm is exhibited. It is thus thought that in the conventional method of roughening a film surface, high surface roughness is required for expecting the anchor effect. Therefore, it has become necessary to develop another adhesion method.

For example, with respect to improvement in adhesiveness to circuit wiring formed on a resin surface having small surface roughness, a technique for improving the adhesiveness by adding a titanium-based organic compound in a polyimide film, likewise polyimide coated with a metal salt comprising Sn, Cu, Zn, Fe, Co, Mn, or Pd to be improved in surface adhesive force, and the like are disclosed (refer to, for example, Japanese publication of patent application; Japanese Patent Laid-Open No. 6-73209 official report (published on Mar. 15, 1994)(U.S. Pat. No. 5,227,224), and Japanese Patent No. 1,948,445 (U.S. Pat. No. 4,742,099)). Also, a method of metallizing a polyimide film produced by applying a heat-resistant surface treatment agent to a solidified polyamic-acid film and then imidizing, is disclosed (refer to, for example, U.S. Pat. No. 5,130,192). Furthermore, a method of applying titanium elements on a surface of a polyimide film is disclosed (refer to, for example, Japanese publication of patent application; Japanese Patent Laid-Open No. 11-71474 official report (published on Mar. 16, 1999). Furthermore, a method is disclosed, in which an intermediate layer is formed on a surface of resin molded product by vapor phase polymerization of oxydianiline and pyromellitic dianhydride used as a raw material of polyimide, and then metallized by vacuum vapor deposition (refer to, for example, Japanese publication of patent application; Japanese Patent Laid-Open No. 2002-192651 official report (published on Jul. 10, 2002) and International Publication No. 03/006553 pamphlet). Also, the present inventors disclose a method for enhancing adhesive strength between polyimide and an adhesive layer, in which a conductor layer is formed on a thermoplastic polyimide surface by dry plating, and then fusion-bonded thereto by pressing and heat treatment (refer to, for example, Japanese publication of patent application Japanese Patent Laid-Open No. 2002-113812 official report (published on Apr. 16, 2002). In order to improve adhesiveness of a metal foil, a method of bonding thermoplastic polyimide to the metal foil is disclosed (refer to, for example, Japanese publication of patent application; Japanese Patent Laid-Open No. 8-230103 official report (published on Sep. 10, 1996).

A copper metal layer formed on a surface of the above-described polyimide film by a physical method such as vacuum evaporation, sputtering, or the like has higher adhesive strength than that of a copper metal layer formed on a surface of an ordinary polyimide film. However, the use of a vacuum process causes the disadvantage of increasing the cost in manufacturing process.

On the other hand, circuit substrates have been required to have higher-density micro-wiring, improved adhesiveness between a polymer film and the microcircuit wiring, and dimensional stability under severer environments of high temperature and high humidity. In particular, the adhesion between the polymer film and the circuit wiring has been required to resist in high-temperature, high-humidity environments.

Furthermore, in a printed wiring board with circuits formed on both surfaces thereof, formation of via holes is indispensable for conducting both surfaces of the wiring board. Therefore, in such a printed wiring board, circuits are generally formed through a step of forming the via holes using a laser, a desmearing step, a catalyst application step, an electroless copper plating step, and the like.

A microcircuit is formed by a so-called subtractive method comprising steps of forming a resist film, electroplating copper on a portion in which an electroless-plated film is exposed, removing the resist film, and etching off the excess electroless-plated copper film, or a semi-additive method comprising steps of forming a resist film, electroplating copper on a portion in which an electroless-plated film is exposed, removing the resist film, etching off the excess electroless-plated copper film. Therefore, of course, the adhesiveness between the wiring circuit and the polymer film must resist these processes.

As described above, for a film having low surface roughness, there has not been found yet a material with which sufficient adhesive strength can be obtained without using a high-cost method or complicated method, and adhesive strength can be maintained in an environment of high temperature and high humidity, and which can resist a process for manufacturing a wiring board.

DISCLOSURE OF INVENTION

The present invention relates to a material including a thermoplastic polyimide resin surface-treated to exhibit an adhesive strength of 5 N/cm or more when an electroless-plated film is formed on a surface thereof.

The surface treatment as above is preferably surface treatment for forming roughness on a surface of a thermoplastic polyimide resin film, surface treatment for partially removing a surface layer of the thermoplastic polyimide resin film, or a combination of the surface treatment for forming roughness on a surface of the thermoplastic polyimide resin film and the surface treatment for partially removing a surface layer of the thermoplastic polyimide resin film.

The surface-treated thermoplastic polyimide resin preferably has a surface with a ten-point medium height Rz of 3 μm or less.

The thermoplastic polyimide resin is preferably produced by dehydration and ring closure of a polyamic acid represented by formula (1):

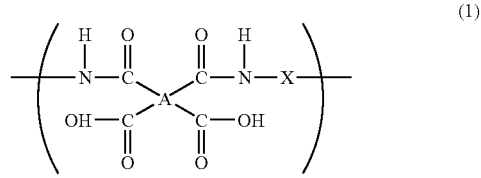

(wherein A represents at least one tetravalent organic group selected from the group (2) below, and X represents a divalent organic group selected from the group (3) below).

Group (2)

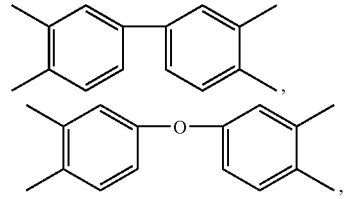

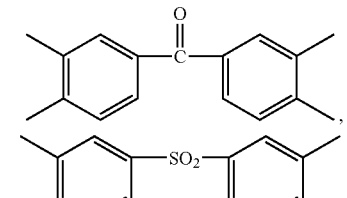

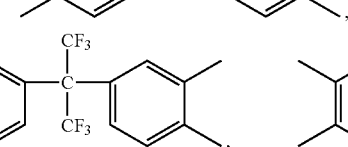

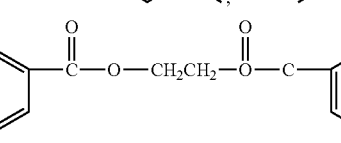

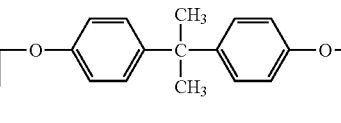

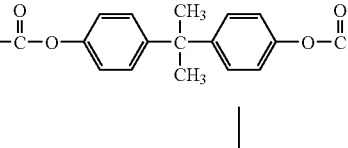

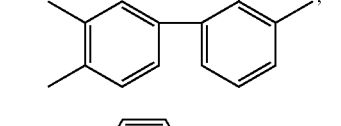

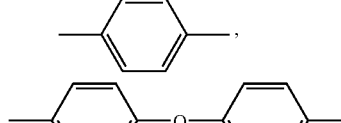

Group (3)

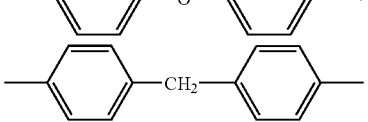

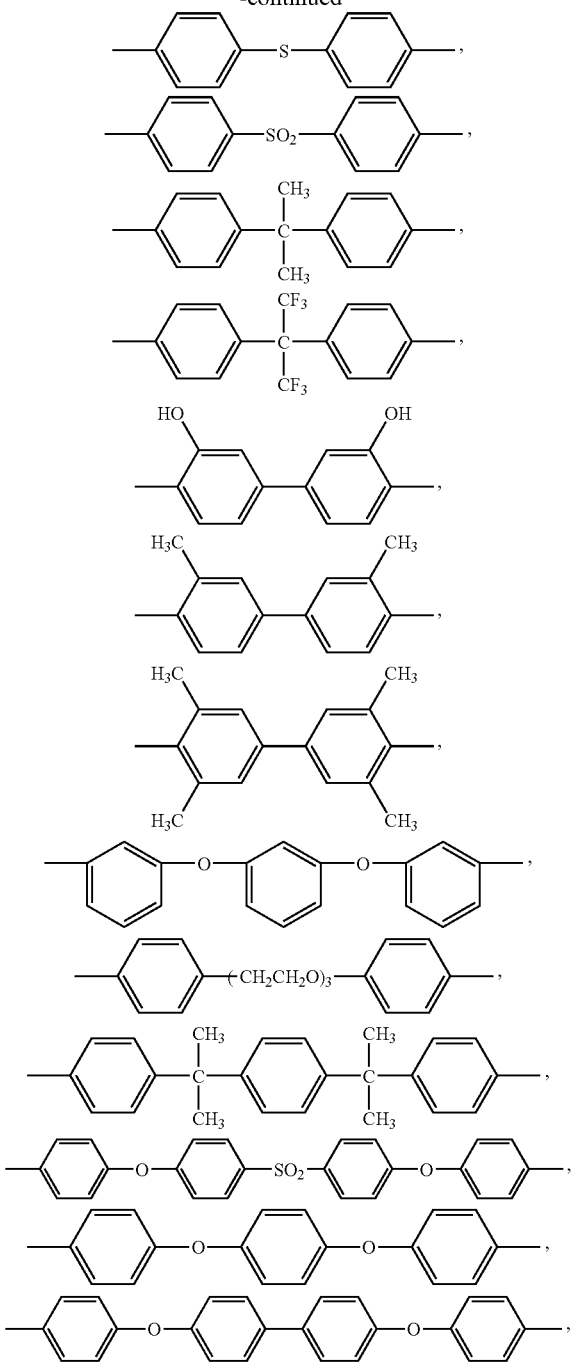

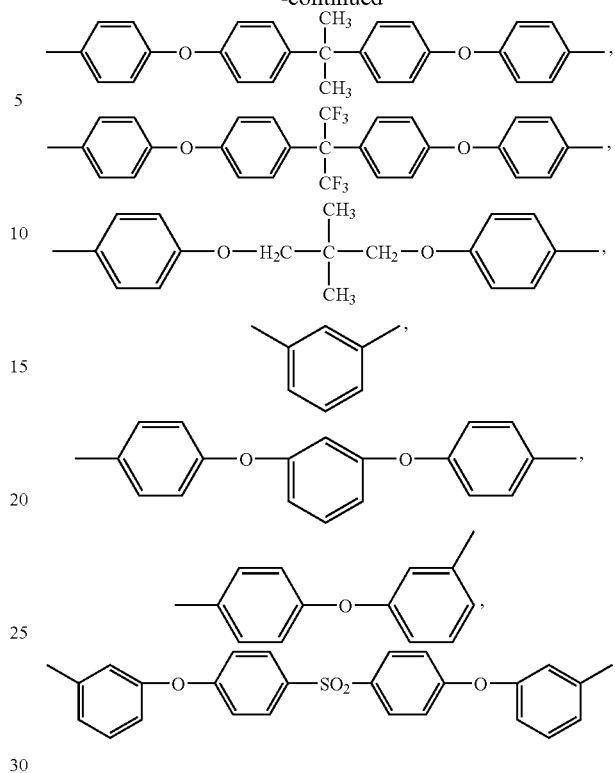

Also, the present invention relates to a laminate comprising a non-thermoplastic polyimide film and a layer provided on one of the surfaces thereof, the layer comprising the material including the thermoplastic polyimide resin.

Furthermore, the present invention relates to a laminate comprising a non-thermoplastic polyimide film, a layer provided on one of the surfaces thereof, the layer comprising the material including the thermoplastic polyimide resin, and a layer comprising the material including the thermoplastic polyimide resin, a copper foil, or an adhesive layer provided on the other surface.

The thickness of the surface layer comprising the material including the thermoplastic polyimide resin and formed on the non-thermoplastic polyimide is preferably 10 μm or less and smaller than that of the non-thermoplastic polyimide film.

Furthermore, the present invention relates to a laminate comprising a polymer film and a layer provided on at least one of the surfaces thereof, the layer comprising a polyimide resin composition containing a thermoplastic polyimide resin and a thermosetting component, and the thermoplastic polyimide resin having a structure represented by formula (2):

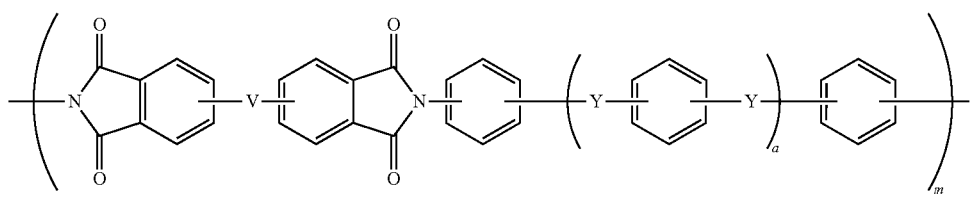

-continued

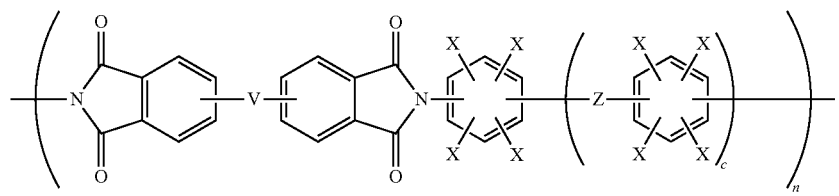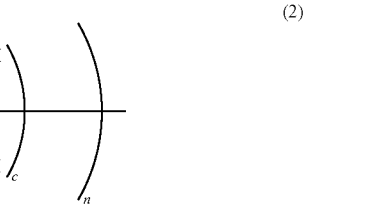

(2)

(wherein m is an integer of 1 or more; n is an integer of 0 or more; V represents —O—, —O-T-O—, or —C(=O)—O-T-O(C=O)—; T represents a divalent organic group; Y's may be the same or different and each represent —C(=O)—, —SO$_2$—, —O—, —S—, —(CH$_2$)$_b$—, —NHCO—, —C(CH$_3$)$_2$—, —C(CF$_3$)$_2$—, —C(=O)O—, or a single bond; a and b independently represent an integer of 0 to 5; Z represents —C(=O)—, —SO$_2$—, —O—, —S—, —(CH$_2$)$_d$—, —NHCO—, —C(CH$_3$)$_2$—, —C(CF$_3$)$_2$—, —C(=O)O—, or a single bond; c and d independently represent an integer of 0 to 5, and X's may be the same or different and each represent an independent functional group containing at least one functional group selected from —OH, —COOH, —OCN, and —CN).

A film or adhesive layer comprising a polyimide resin composition including a thermoplastic polyimide resin and a thermosetting component is preferably provided on the surface opposite to the surface on which the layer comprising the polyimide resin composition containing the thermoplastic polyimide resin and the thermosetting component is provided.

Furthermore, present invention relates to a resin film having a surface roughness formed on at least one of the surfaces thereof, the surface shape having an arithmetic mean roughness Ra1 value of 0.05 μm to 1 μm measured with a cutoff value of 0.002 mm, and a Ra1/Ra2 ratio of 0.4 to 1, Ra2 being a value measured with a cutoff value of 0.1 mm.

The resin film preferably contains a polyimide resin.

Furthermore, the present invention relates to a laminate comprising at least one layer of the resin film as above.

A metal layer is preferably formed on the surface having the above-described surface shape.

The present invention relates to a method for manufacturing a printed wiring board using the laminate or the resin film.

The method preferably includes at least a step of electroless copper plating.

The method preferably includes a step of opposing a metal foil to the surface of the above-described laminate on which the layer comprising the polyimide resin composition containing the thermoplastic polyimide resin and/or the thermosetting component is formed, opposing a circuit plane of an inner wiring board to the other surface with an adhesive provided therebetween, laminating the metal foil, the laminate, and the inner circuit board by a method under heating and/or pressing to form a laminate, and removing the metal foil from the surface of the laminate.

The method preferably comprises at least a step of forming a metal layer by sputtering.

A circuit is preferably formed by a subtractive process or a semi-additive process.

BEST MODE FOR CARRYING OUT THE INVENTION

Figure 1:
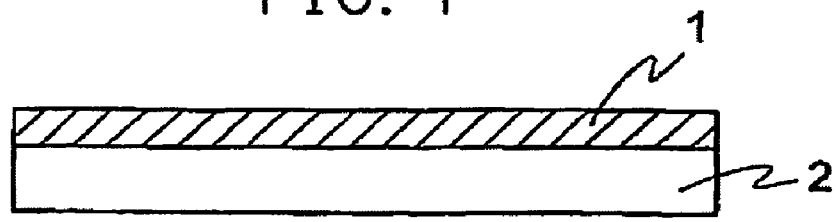
FIG. 1 is a drawing showing an example of the constitution of the present invention.

Embodiments of the present invention will be described in detail below.

In an embodiment of the present invention, a material containing a thermoplastic polyimide resin is subjected to specified surface treatment to improve adhesive strength and exhibit sufficiently higher adhesive strength than that expected as an anchor effect regardless of its low surface roughness, as compared with conventional materials such as epoxy resin and the like.

The thermoplastic polyimide has a glass transition temperature and can be plastically molded in a temperature range of the glass transition temperature or more apart from a so-called non-thermoplastic polyimide synthesized from, for example, pyromellitic dianhydride and oxydianiline.

The material containing the thermoplastic polyimide resin of the present invention preferably comprises only the thermoplastic polyimide resin, but it may contain other components, such as a thermosetting component used for an adhesive layer, which will be described below. The content of the thermoplastic polyimide resin is preferably 30 mol % or more and more preferably 50 mol % or more. When the content of the thermoplastic polyimide resin is less than 30 mol %, sufficient adhesive strength cannot be obtained with an adhesive layer having low surface roughness.

The thermoplastic polyimide resin used in the present invention is preferably produced by dehydration and ring closure of a polyamic acid represented by formula (1):

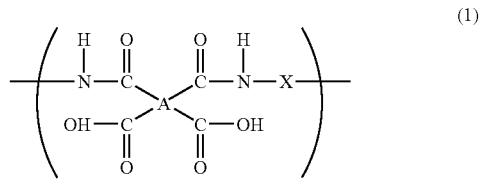

(1)

wherein A is preferably at least one tetravalent organic group selected from the following group (2):

Group (2)

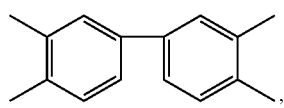

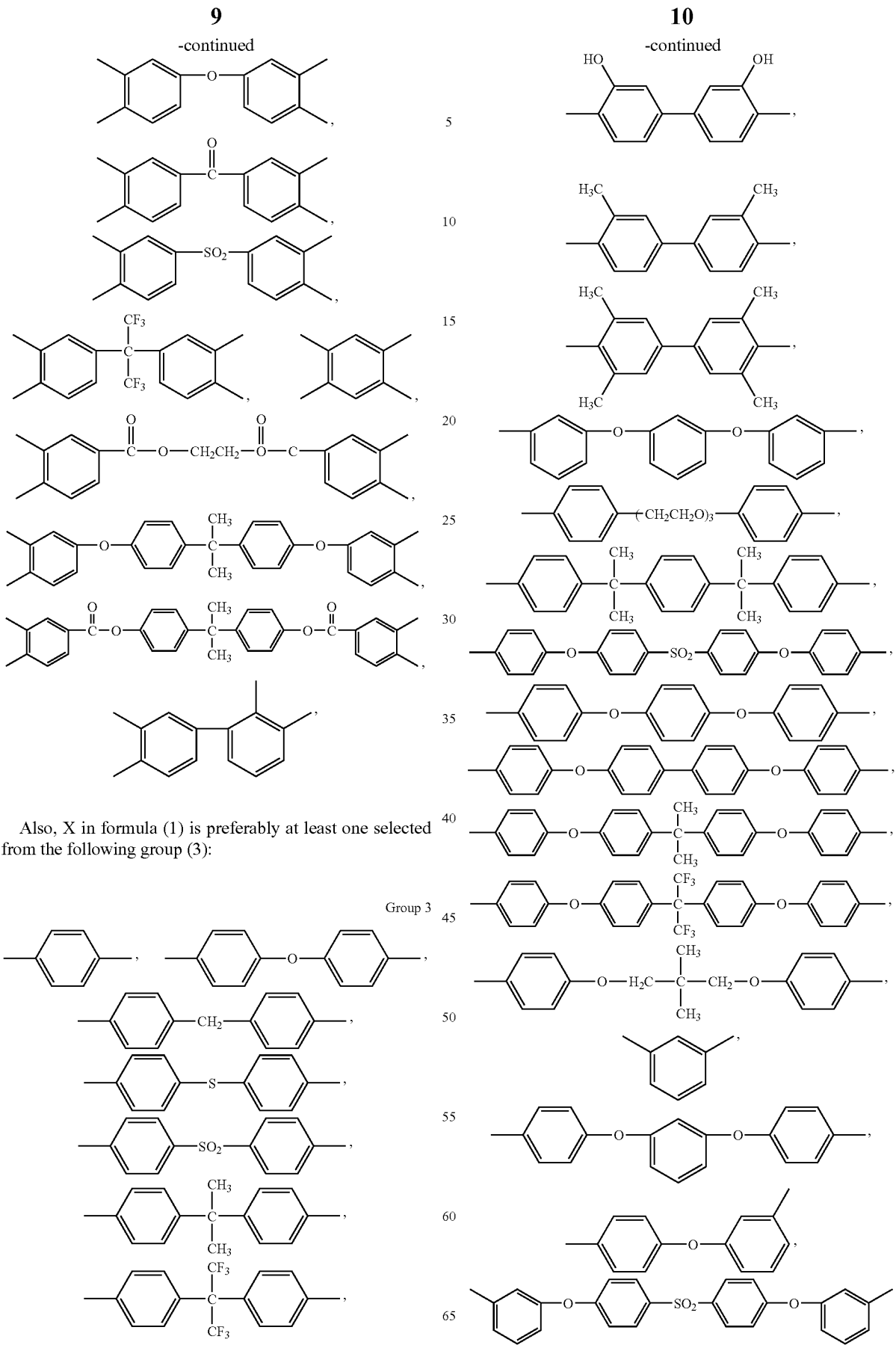
Also, X in formula (1) is preferably at least one selected from the following group (3):

The thermoplastic polyimide resin represented by formula (1) is synthesized from an acid dianhydride compound and a diamine compound used as raw materials. Examples of the acid dianhydride for producing the thermoplastic polyimide include tetracarboxylic dianhydrides such as pyromellitic dianhydride, 3,3',4,4'-benzophenonetetracarboxylic dianhydride, bis(3,4-dicarboxyphenyl)sulfone dianhydride, 2,2',3,3'-biphenyltetracarboxylic dianhydride, 2,3,3',4'-biphenyltetracarboxylic dianhydride, 3,3',4,4'-biphenyltetracarboxylic dianhydride, oxydiphthalic dianhydride, bis(2,3-dicarboxyphenyl)methane dianhydride, bis(3,4-dicarboxyphenyl)methane dianhydride, 1,1-bis(2,3-dicarboxyphenyl)ethane dianhydride, 1,1-bis(3,4-dicarboxyphenyl)ethane dianhydride, 1,2-bis(3,4-dicarboxyphenyl)ethane dianhydride, 2,2-bis(3,4-dicarboxyphenyl)propane dianhydride, 1,3-bis(3,4-dicarboxyphenyl)propane dianhydride, 4,4'-hexafluoroisopropylidenediphthalic anhydride, 1,2,5,6-naphthalenetetracarboxylic dianhydride, 2,3,6,7-naphthalenetetracarboxylic dianhydride, 3,4,9,10-perylenetetracarboxylic dianhydride, p-phenylenebis(trimellitic acid monoester anhydride), ethylenebis(trimellitic acid monoester anhydride), bisphenol A bis(trimellitic acid monoester anhydride), 4,4'-(4,4'-isopropylidenediphenoxy) bis(phthalic anhydride), and p-phenylenediphthalic anhydride. Preferably, at least one dianhydride is selected from these compounds.

As the diamine for obtaining the thermoplastic polyimide, at least one diamine is preferably selected from 1,4-diaminobenzene(p-phenylenediamine), 1,3-diaminobenzene, 1,2-diaminobenzene, benzidine, 3,3'-dichlorobenzidine, 3,3'-dimethylbenzidine, 3,3'-dimethoxybenzidine, 3,3'-dihydroxybenzidine, 3,3',5,5'-tetramethylbenzidine, 4,4'-diaminodiphenylpropane, 4,4'-diaminodiphenylhexafluoropropane, 1,5-diaminonaphthalene, 4,4'-diaminodiphenyldiethylsilane, 4,4'-diaminodiphenylsilane, 4,4'-diaminodiphenylethylphosphine oxide, 4,4'-diaminodiphenyl-N-methylamine, 4,4'-diaminodiphenyl-N-phenylamine, 4,4'-diaminodiphenyl ether, 3,4'-diaminodiphenyl ether, 3,3'-diaminodiphenyl ether, 4,4'-diaminodiphenyl thioether, 3,4'-diaminodiphenyl thioether, 3,3'-diaminodiphenyl thioether, 3,3'-diaminodiphenylmethane, 3,4'-diaminodiphenylmethane, 4,4'-diaminodiphenylmethane, 4,4'-diaminodiphenylsulfone, 3,4'-diaminodiphenylsulfone, 3,3'-diaminodiphenylsulfone, 4,4'-diaminobenzanilide, 3,4'-diaminobenzanilide, 3,3'-diaminobenzanilide, 4,4'-diaminobenzophenone, 3,4'-diaminobenzophenone, 3,3'-diaminobenzophenone, bis[4-(3-aminophenoxy)phenyl]methane, bis[4-(4-aminophenoxy)phenyl]methane, 1,1-bis[4-(3-aminophenoxy)phenyl]ethane, 1,1-bis[4-(4-aminophenoxy)phenyl]ethane, 1,2-bis[4-(3-aminophenoxy)phenyl]ethane, 1,2-bis[4-(4-aminophenoxy)phenyl]ethane, 2,2-bis[4-(3-aminophenoxy)phenyl]propane, 2,2-bis[4-(4-aminophenoxy)phenyl]propane, 2,2-bis[4-(3-aminophenoxy)phenyl]butane, 2,2-bis[3-(3-aminophenoxy)phenyl]-1,1,1,3,3,3-hexafluoropropane, 2,2-bis[4-(4-aminophenoxy)phenyl]-1,1,1,3,3,3-hexafluoropropane, 1,3-bis(3-aminophenoxy)benzene, 1,4-bis(3-aminophenoxy)benzene, 1,4-bis(4-aminophenoxy)benzene, 4,4'-bis(4-aminophenoxy)biphenyl, 4,4'-bis(3-aminophenoxy)biphenyl, bis[4-(3-aminophenoxy)phenyl]ketone, bis[4-(4-aminophenoxy)phenyl]ketone, bis[4-(3-aminophenoxy)phenyl]sulfide, bis[4-(4-aminophenoxy)phenyl]sulfide, bis[4-(3-aminophenoxy)phenyl]sulfone, bis[4-(4-aminophenoxy)phenyl]sulfone, bis[4-(3-aminophenoxy)phenyl]ether, bis[4-(4-aminophenoxy)phenyl]ether, 1,4-bis[4-(3-aminophenoxy)benzoyl]benzene, 1,3-bis[4-(3-aminophenoxy)benzoyl]benzene, 4,4'-bis[3-(4-aminophenoxy)benzoyl]diphenyl ether, 4,4'-bis[3-(3-aminophenoxy)benzoyl]diphenyl ether, 4,4'-bis[4-(4-amino-α,α-dimethylbenzyl)phenoxy]benzophenone, 4,4'-bis[4-(4-amino-α,α-dimethylbenzyl)phenoxy]diphenylsulfone, bis[4-{4-(4-aminophenoxy)phenoxy}phenyl]sulfone, 1,4-bis[4-(4-aminophenoxy)-α,α-dimethylbenzyl]benzene, 1,3-bis[4-(4-aminophenoxy)-α,α-dimethylbenzyl]benzene, 4,4'-diaminodiphenylethylphosphine oxide, 1,3-bis(4-aminophenoxy)benzene, and 1,4-bis(4-aminophenoxy)benzene.

Among combinations of these acid dianhydrides and diamines for obtaining the thermoplastic polyimide resin of the present invention, a preferred combination includes at least one acid dianhydride selected from acid dianhydrides producing the acid dianhydride residues in group (2) and at least one diamine selected from diamines producing the diamine residues in group (3). At least one acid dianhydride selected from acid dianhydrides producing the acid dianhydride residues in group (2) is preferably used in an amount of 50 mol % or more of a total of acid dianhydrides, and at least one diamine selected from diamines producing the diamine residues in group (3) is preferably used in an amount of 50 mol % or more of a total of diamines.

Among the above-described acid dianhydrides and diamines, 2,3,3',4'-biphenyltetracarboxylic dianhydride, 3,3',4,4'-biphenyltetracarboxylic dianhydride, oxydiphthalic dianhydride, ethylenebis(trimellitic acid monoester anhydride), bisphenol A bis(trimellitic acid monoester anhydride), and 4,4'-(4,4'-isopropylidenediphenoxy)bis(phthalic anhydride) are more preferred. Also, 1,3-diaminobenzene, 3,4'-diaminodiphenyl ether, 4,4'-diaminodiphenyl ether, 1,3-bis(3-aminophenoxy)benzene, 1,3-bis(4-aminophenoxy)benzene, 1,4-bis(4-aminophenoxy)benzene, 2,2-bis[4-(4-aminophenoxy)phenyl]propane, 4,4'-bis(4-aminophenoxy)biphenyl, and bis[4-(4-aminophenoxy)phenyl]sulfone are more preferred. This is because these acid dianhydrides and diamines are industrially available and produce thermoplastic polyimides having excellent properties such as low water absorption, low dielectric constants, low dielectric loss tangents, etc., and also exhibit the effect of increasing adhesive strength to an electroless-plated film, which is the advantage of the present invention.

A polyamic acid which is a precursor of the thermoplastic polyimide used in the present invention is obtained as a polyamic acid in organic solvent solution prepared by dissolving substantially equal moles of at least one of the above acid dianhydrides and at least one of the above diamines in an organic solvent, and then performing reaction.

The thermoplastic polyimide resin can be produced by imidizing the polyamic acid, which is a precursor, by either a thermal curing method or a chemical curing method. In the thermal curing method, imidization reaction is progressed only by heating without using a dehydration-ring closure agent or the like. Specific example of this method includes heat-treating the polyamic acid solution to progress the imidization reaction, and, at the same time, evaporating the organic solvent. This method can produce the solid thermoplastic polyimide resin. Although the heating conditions are not particularly limited, heating process is preferably performed at a temperature range of 300° C. or less for a time of about 5 minutes to 200 minutes.

In the chemical imidizing method, a chemical dehydrating agent such as an acid anhydride, e.g., acetic anhydride or the like, and a catalyst such as a tertiary amine, e.g., isoquinoline, β-picoline, pyridine, or the like, are acted on the polyamic acid in organic solvent solution. A specific example of this method includes adding a stoichiometic amount or more of the dehydrating agent to the polyamic acid solution to effect dehydration reaction and evaporate the organic solvent. This method can produce the solid thermoplastic polyimide resin.

Examples of the dehydrating agent used in the chemical curing method include aliphatic acid anhydrides such as acetic anhydride and the like, aromatic anhydrides such as benzoic anhydride and the like, 1,3-dichlorohexylcarbodiimide, N,N'-dialkylcarbodiimide, lower aliphatic halides, halogenated lower aliphatic halides, halogenated lower fatty acid anhydrides, arylsulfonic acid dihalides, thionyl halides, and mixtures of two or more of these compounds. Among these compounds, aliphatic acid anhydrides such as acetic anhydride, propionic anhydride, and butyric anhydride, or mixtures of two or more of these compounds are preferably used. The chemical conversion agent is used in an amount of 1 to 10 times, preferably 1 to 7 times, and more preferably 1 to 5 times, to the number of the moles of the polyamic acid sites in the polyamic acid solution. In order to perform effective imidization, the chemical conversion agent and the catalyst are preferably used at the same time. Examples of the catalyst include aliphatic tertiary amines such as triethylamine and the like, aromatic tertiary amines such as dimethylaniline and the like, and heterocyclic tertiary amines such as pyridine, α-picoline, β-picoline, γ-picoline, quinoline, and isoquinoline and the like. In particular, the catalyst is preferably selected from the heterocyclic tertiary amines. The catalyst is added in an amount of 1/20 to 10 times, preferably 1/15 to 5 times, and more preferably 1/10 to 2 times, to the number of the moles of the chemical conversion agent. With excessively small amounts of the chemical conversion agent and the catalyst, imidization does not effectively proceed, while with excessively large amounts of the chemical conversion agent and the catalyst, rapid imidization proceeds to cause difficulty in handling. Furthermore, chemical dehydration and ring closure are preferably performed at a temperature of 100° C. or less, and the organic solvent is preferably evaporated at a temperature of 200° C. or less for a time of about 5 minutes to 120 minutes. Another method for producing the polyimide resin does not include evaporating the solvent in the thermal or chemical dehydration and ring closure. Specifically, a thermoplastic polyimide resin solution prepared by thermal imidization or chemical imidization using a dehydrating agent is poured into a poor solvent to precipitate the thermoplastic polyimide resin, unreacted monomers are removed, and then the resulting polyimide resin is purified and dried to obtain the solid thermoplastic polyimide resin. As the poor solvent, a solvent having high compatibility with the solvent and low dissolving power for the polyimide is selected. Examples of the solvent include, without limitation to, acetone, methanol, ethanol, isopropanol, benzene, methyl cellosolve, and methyl ethyl ketone.

A method of imidization by heating under reduced pressure can also be used. This imidization method is capable of positively removing the water produced in imidization to the outside of the system to suppress the hydrolysis of a polyamic acid polymer, and thereby obtaining a high-molecular-weight thermoplastic polyimide.

In the method of imidization by heating under reduced pressure, heating is preferably performed at 80 to 400° C., more preferably 100° C. or more and most preferably 120° C. or more, for effective imidization and effective removal of water.

The reduced pressure is preferably as low as possible. Specifically, the pressure is $9 \times 10^4$ to $1 \times 10^2$ Pa, preferably $9 \times 10^4$ to $1 \times 10^2$ Pa, and more preferably $7 \times 10^4$ to $1 \times 10^2$ Pa.

Furthermore, the chemical curing method and the thermal curing method may be combined. The imidization conditions may be appropriately determined according to the type of the polyamic acid used, the form of the resultant resin, selection of the thermal curing method and/or the chemical curing method, etc.

Examples of the solvent used in reaction for producing the polyamic acid polymer solution include sulfoxide solvents such as dimethylsulfoxide and diethylsulfoxide and the like; formamide solvents such as N,N-dimethylformamide and N,N-diethylformamide and the like; acetamide solvents such as N,N-dimethylacetamide and N,N-diethylacetamide and the like; pyrolidone solvents such as N-methyl-2-pyrolidone and N-vinyl-2-pyrolidone and the like; phenol solvents such as phenol, o-, m-, or p-cresol, xylenol, halogenated phenol, catechol and the like; hexamethylphosphoramide; and γ-butyrolactone. Among these solvents, N,N-dimethylformamide is particularly preferably used. Furthermore, such an organic polar solvent may be combined with an aromatic hydrocarbon such as xylene or toluene according to demand. A mixture of the acid dianhydride component and the diamine component is stirred in the solvent to obtain the polyamic acid polymer solution. For the reaction, the addition order of these raw materials, the reaction time, and the reaction temperature are not particularly limited.

The thermoplastic polyimide resin material produced by the imidization can be formed in various shapes such as a molding, a single-layer film, a laminate comprising a layer of the material containing the thermoplastic polyimide resin, the layer being formed on a support, and the like. In application to a printed wiring board according to the present invention, the single-layer film or laminate comprising the thermoplastic polyimide resin is preferred. In the laminate, the support preferably comprises a non-thermoplastic polyimide film from the viewpoint of heat resistance, dimensional stability, interfacial adhesiveness, etc. When a copper foil is used as the support, desirably the copper foil can be used as the support and also used for subsequent surface treatment of the thermoplastic polyimide resin, which will be described below.

For the laminate according to the present invention, various methods can be used as a method for forming the layer comprising the thermoplastic polyimide resin on the heat-resistant non-thermoplastic polyimide film used as the support.

For example, when the thermoplastic polyimide is insoluble in a solvent, preferably, a solution of a polyamic acid, which is a precursor, is applied to the non-thermoplastic polyimide film by casting, and then imidization and solvent drying are performed by the above-described method to form the layer comprising the thermoplastic polyimide resin. When the thermoplastic polyimide is soluble in a solvent, the thermoplastic polyimide resin is formed in a powder, fibers, or a film and dissolved in a solvent to prepare a thermoplastic polyimide solution, the solution is applied to the non-thermoplastic polyimide film by casting, and the solvent is evaporated by drying to form the layer comprising the thermoplastic polyimide resin. In this case, as in the case in which the thermoplastic polyimide is insoluble, the method of applying the polyamic acid, which is a precursor, to the non-thermoplastic polyimide film by casting can be used. In another applicable method, a solution of a polyamic acid, which is a precursor of the non-thermoplastic polyimide, and a solution of a polyamide, which is a precursor of the thermoplastic polyimide, or a solution of the thermoplastic polyimide are coextruded and subjected to imidization and solvent evaporation to form a laminate comprising a layer of the thermoplastic polyimide resin and a layer of the non-thermoplastic polyimide film. A further applicable method for forming the laminate comprises producing a film of the thermoplastic polyimide resin, and laminating the film on the non-thermoplastic polyimide film by a known lamination method such as pressing, lamination, or the like.

The non-thermoplastic polyimide film used in the present invention can be produced by a known method. Namely, the polyamic acid is applied to the support by casting, and then chemically or thermally imidized to obtain the non-thermoplastic polyimide film.

As the polyamic acid which is a precursor of the non-thermoplastic polyimide used in the present invention, basically, any known polyamic acid can be used.

Suitable examples of the acid anhydride for synthesizing the non-thermoplastic polyimide used in the present invention include the acid anhydrides described for the thermoplastic polyimide, and the analogues thereof. In particular, pyromellitic dianhydride, oxydiphthalic dianhydride, 3,3',4,4'-benzophenonetetracarboxylic dianhydride, 3,3',4,4'-biphenyltetracarboxylic dianhydride, and p-phenylenebis(trimellitic acid monoester anhydride) are preferred. These anhydrides are preferably used alone or in a mixture at a desired ratio.

Examples of the diamine used for synthesizing the non-thermoplastic polyimide in the present invention include the same diamines as those described for the thermoplastic polyimide, and the analogues thereof. In particular, 4,4'-diaminodiphenyl ether, 4,4'-diaminobenzanilide, p-phenylenediamine, and p-phenylenebis(trimellitic acid monoester anhydride), and mixtures thereof.

Examples of a preferred combination of the acid dianhydride and the diamine for the non-thermoplastic polyimide film of the present invention include pyromellitic dianhydride/4,4'-diaminodiphenyl ether, pyromellitic dianhydride/4,4'-diaminodiphenyl ether/p-phenylenediamine, pyromellitic dianhydride/p-phenylenebis(trimellitic acid monoester anhydride)/4,4'-diaminodiphenyl ether/p-phenylenediamine, p-phenylenediamine/3,3',4,4'-biphenyltetracarboxylic dianhydride, and 3,3',4,4'-biphenyltetracarboxylic dianhydride/p-phenylenebis(trimellitic acid monoester anhydride)/p-phenylenediamine/4,4'-diaminodiphenyl ether. Since the non-thermoplastic polyimide synthesized by such a monomer combination exhibits excellent properties such as appropriate elastic modulus, likable dimensional stability, low water absorption, and the like, the non-thermoplastic polyimide is suitably used for the laminate in the present invention.

Synthesis of the polyamic acid and synthesis of polyimide by imidization of the polyamic acid can be performed under the same conditions as those for synthesizing the thermoplastic polyimide. However, from the viewpoint of film toughness, breaking strength, and productivity, the chemical curing method is preferred as the imidization method.

The non-thermoplastic polyimide film produced by any of the various methods may be mixed with an inorganic or organic filler, a plasticizer such as an organophosphorus compound, an antioxidant by a known method, or may be surface-treated by known physical surface treatment such as corona discharge treatment, plasma discharge treatment, or ion gun treatment, or chemical surface treatment such as primer treatment to impart more excellent characteristics.

The non-thermoplastic polyimide resin is produced using the same acid dianhydride and diamine as those for the thermoplastic polyimide resin. However, the thermoplastic polyimide resin has a glass transition temperature and can be plastically deformed by heating at the glass transition temperature or more. While the non-thermoplastic polyimide resin can not be easily plastically deformed by heating regardless of the presence of a glass transition temperature. Therefore, both polyimide resins are different.

Although a polyimide resin can be produced by reaction of at least one acid anhydride and at least one diamine, the thermoplastic polyimide resin or the non-thermoplastic polyimide resin can be produced by appropriately selecting the types of the acid anhydride and diamine, the mixing ratio of a plurality of acid anhydrides, the mixing ratio of a plurality of diamines and the lilke when two or more acid anhydrides and two or more diamines are used.

In order to obtain the thermoplastic polyimide resin, the acid anhydride and diamine each having a flexible group or an asymmetric structure may be selected. When a plurality of acid anhydrides or a plurality of diamines is used, the mixing ratio of the acid anhydrides or diamines each having flexibility or an asymmetric structure may be increased.

The thickness of the non-thermoplastic polyimide film is preferably 2 µm to 125 µm, and more preferably 5 µm to 75 µm. With a thickness of less than 2 µm, the laminate has insufficient rigidity, and the film is difficult to handle. Furthermore, it becomes difficult to form the thermoplastic polyimide layer on the surface of the film. With a thickness of over 125 µm, a circuit width must be increased with an increase in thickness of an insulating layer in view of impedance control, thereby opposing to the need for a smaller printed wiring board with a higher density.

Next, the method for surface-treating the thermoplastic polyimide resin of the present invention will be described. The surface-treated thermoplastic polyimide resin of the present invention is strongly bonded to an electroless-plated film formed on its surface, for example, with an adhesive strength of 5 N/cm or more, preferably 7 N/cm or more, and more preferably 9 N/cm or more. The combination of the thermoplastic polyimide and suitable surface treatment enables strong bonding of an electroless-plated copper film in spite of its lower surface roughness than conventional roughness. With an adhesive strength of less than 5 N/cm, a metal layer separates from the resin surface during manufacture of the printed wiring board, and as a result, the problem of deviating or dropping out on a wiring circuit tends to occur.

The electroless-plated film can be formed by a known method, preferably electroless copper plating, electroless nickel plating, or electroless gold plating. In particular, the electroless copper plating is preferred from the viewpoint of excellent balance between properties such as availability of chemicals, cost, adhesion to the resin surface, conductivity, processability, and the like.

As a result of several researches, some proper methods for surface treatment of the present invention were found. The methods will be described in detail below.

One of the surface treatment methods includes forming irregularity on the surface of the thermoplastic polyimide resin. It is known that adhesive strength to the electroless-plated film tends to increase as the roughness of the irregular surface increases. On the other hand, the pitch of formable wiring tends to increase as the roughness of the irregular surface increases regardless of whether the wiring is formed by the subtractive method or the semi-additive method. Therefore, increases in surface roughness are undesirable for increasing the wiring density. In the present invention, the thermoplastic polyimide is selected as a material to be surface-treated, and thus the electroless-plated film can be strongly bonded in spite of its lower surface roughness than conventional surface roughness. Therefore, strong adhesion of wiring and formation of finer wiring can be simultaneously realized, thereby complying with the need for a higher-density printed wiring board.

A specific example of the method is a surface treatment method in which the thermoplastic polyimide resin and a metal foil having a roughened surface are laminated, and then the metal foil is removed. As the metal foil, any known metal foil can be used. Examples of such a metal foil include a copper foil, an aluminum foil, a nickel foil, and a gold foil, but the copper foil which is generally used in a various industrial products is advantageous in view of cost and wide variety, and thus can be preferably used. The metal foil is used for roughening the surface of the thermoplastic polyimide resin by a method in which the thermoplastic polyimide resin and the metal foil are laminated by a known process such as thermal pressurization, thermal lamination or the like, and then the metal foil is removed by a process of physically peeling the metal foil, dissolving the metal foil, or the like to form a roughened surface on the thermoplastic polyimide resin. Therefore, the metal foil preferably has a roughened surface on at least one of its surfaces.

The roughness of the roughened surface of the metal foil affects the adhesive strength between the thermoplastic polyimide resin and the electroless-plated film, and the pitch of wiring formable on the thermoplastic polyimide resin. In other words, as the roughness of the metal foil increases, the roughness of the irregular surface formed on the thermoplastic polyimide resin tends to increase, and also the adhesive strength to the electroless-plated film tends to increase. On the other hand, the pitch of formable wiring tends to increase regardless of whether the wiring is formed by the subtractive method or the semi-additive method. Thus, increases in roughness are undesirable for increasing the wiring density. Specifically, the surface roughness Rz (ten-point medium height) of the roughened surface of the metal foil is preferably 3 μm or less, more preferably 2 μm or less, and most preferably 1.5 μm or less. This roughness is preferred because the surface roughness Rz of the irregular surface formed on the thermoplastic polyimide resin is also 3 μm or less, micro-wiring with a L/S of 25 μm m/25 μm or less can be formed, and the adhesive strength is 5 N/cm or more. As the copper foil, an electrolytic copper foil and a rolled copper foil are widely used, and any one of the copper foils has a roughened surface, i.e., a matte surface, on at least one surface, for increasing the adhesive strength to the resin. Also, matte surfaces with various degrees of roughness can be obtained using copper foil products, but the matte surface of the rolled copper foil can be preferably used because of its relatively low surface roughness Rz.

Another preferred method for forming irregularity on the surface of the thermoplastic polyimide resin comprises embossing, sand blasting, or polishing on the surface of the thermoplastic polyimide resin. Embossing can be performed by bringing the thermoplastic polyimide resin into contact with a metal material having surface irregularity to form surface irregularity on the resin surface. The embossing is preferably accompanied with heating and pressing, and performed under conditions for forming proper irregularity. Also, sand blasting and polishing are preferably performed under conditions for forming proper irregularity.

A surface treatment method of partially removing the surface layer of the thermoplastic polyimide resin can be preferably applied as the method for surface-treating the thermoplastic polyimide resin. This surface treatment method is to dissolve a proper thickness of the surface of the thermoplastic resin, and thereby the adhesiveness to the electroless-plated film can be increased. Although the reason for this is not known, it is understood that by this surface treatment, irregularity is formed on the resin surface and/or the surface layer of the thermoplastic polyimide resin is dissolved to change the chemical structure, thereby causing a favorable effect on the adhesiveness to the electroless-plated film. The term "partially removing" means a state in which the entire surface layer of the thermoplastic polyimide resin is uniformly removed or a state in which the surface layer is nonuniformly removed, i.e., removed or left in an island-like form.

Specific examples of the surface treatment method of partially removing the surface layer of the thermoplastic polyimide resin include a method of vapor phase treatment, such as treatment with corona discharge, atmospheric-pressure plasma, vacuum plasma, electron rays, laser, RIE, or the like; and a method of liquid phase treatment, such as treatment with a liquid that dissolves the thermoplastic polyimide resin. These treatment methods possibly have the effect of strongly bonding the electroless-plated film because a fine irregular surface can be formed on the thermoplastic polyimide resin, and also have the effect of chemically activating the resin surface. Among these treatment methods, the method of vapor phase treatment with corona discharge, atmospheric-pressure plasma, vacuum plasma, or electron rays, and the method of liquid phase treatment are industrially simple and preferably carried out. The liquid phase treatment is not particularly limited as long as the thermoplastic polyimide resin is dissolved to achieve the object of the present invention. More specifically, a water-soluble liquid containing a permanganate or organic alkali compound, which is widely used in a desmearing step and etching of polyimide during manufacture of the printed wiring board, or an organic solvent is preferably used. Preferred examples of the organic solvent which dissolves the thermoplastic polyimide resin include amide solvents, such as N,N-dimethylformamide, N,N-dimethylacetamide, and N-methyl-2-pyrrolidone. In particular, N,N-dimethylformamide is preferably used.

The surface treatment method for the thermoplastic polyimide resin and the specific examples thereof have been described above with respect to "surface treatment for forming irregularity on the surface of the thermoplastic polyimide resin" and "surface treatment for partially removing the surface layer of the thermoplastic polyimide resin". However, it was found that combination of these methods is also effective. Specifically, "surface treatment for forming irregularity on the surface of the thermoplastic polyimide resin" and "surface treatment for partially removing the surface layer of the thermoplastic polyimide resin" are combined, and various combinations are effective. In particular, combination of "surface treatment for forming irregularity on the surface of the thermoplastic polyimide resin" and the liquid phase treatment including dissolving the thermoplastic polyimide resin is particularly effective. More specifically, it is particularly effective that the thermoplastic polyimide resin surface-treated with the metal foil is treated with a permanganate, an organic alkali compound, or an organic solvent.

The surface roughness Rz of the thermoplastic polyimide resin resulting from the above-described surface treatment is preferably 3 μm or less from the viewpoint of forming micro-wiring. With a surface roughness Rz of 3 μm or less, a high-density circuit with a L/S of 25/25 μm or less can be formed, and no etching residue remains in the surface irregularity of the resin after the etching process. The surface roughness Rz is defined according to the surface shape standards of JIS (Japanese Industrial Standards) B0601 or the like. The surface roughness Rz can be measured with a stylus-type surface roughness meter of JIS B0651 or an optical interference-type surface roughness meter of B0652. In the invention, the ten-point medium height of the surface of the thermoplastic polyimide resin is measured with an optical interference-type surface roughness meter, New View 5030 System, manufactured by ZYGO Corporation.

It was further found that by using the above-mentioned surface treatment for the thermoplastic polyimide resin, strong bonding between the electroless-plated film and a surface with lower roughness than conventional roughness can be realized, and excellent adhesive strength can be maintained after a pressure cooker test. As a result, a higher-density of printed wiring board, i.e., micro-wiring, can be formed.

Figure 2:
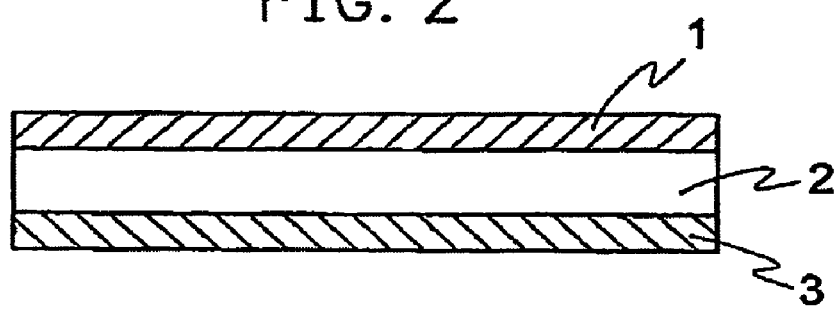
FIG. 2 is a drawing showing an example of the constitution of the present invention.
Figure 3:
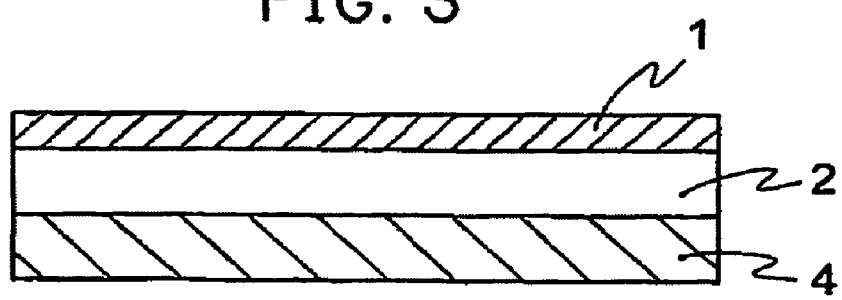
FIG. 3 is a drawing showing an example of the constitution of the present invention.
Figure 4:
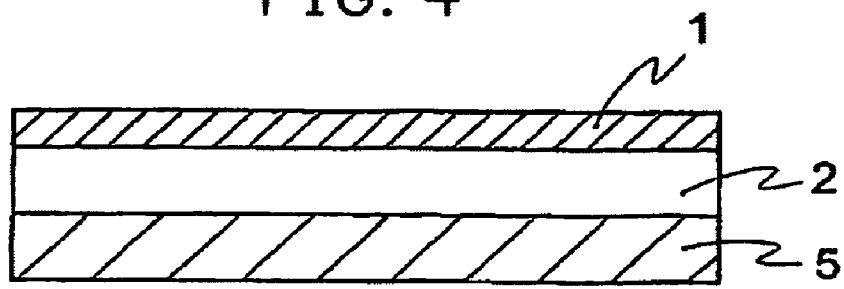
FIG. 4 is a drawing showing an example of the constitution of the present invention.

Next, a laminate of the present invention will be described below. Namely, description will be made of a two-layer structure laminate comprising a layer (1) containing the surface-treated thermoplastic polyimide resin and a non-thermoplastic polyimide film (2), as shown in FIG. 1, a three-layer structure laminate comprising a layer (1) containing the surface-treated thermoplastic polyimide resin, a non-thermoplastic polyimide film (2), and a layer (3) containing the thermoplastic polyimide resin, as shown in FIG. 2, a three-layer structure laminate comprising a layer (1) containing the surface-treated thermoplastic polyimide resin, a non-thermoplastic polyimide film (2), and a copper foil layer (4), as shown in FIG. 3, and a three-layer structure laminate comprising a layer (1) containing the surface-treated thermoplastic polyimide resin, a non-thermoplastic polyimide film (2), and an adhesive layer (5), as shown in FIG. 4. However, the layer (3) containing the thermoplastic polyimide resin may be a layer surface-treated or not surface-treated.

Any one of the laminates of the present invention comprises the layer containing the thermoplastic polyimide resin formed on the non-thermoplastic polyimide film. The non-thermoplastic polyimide film, the thermoplastic polyimide, and the lamination method are as described above. The thickness of the layer containing the thermoplastic polyimide in the laminate of the present invention is preferably as small as possible for making use of the physical properties of the non-thermoplastic polyimide film having excellent properties as a circuit board, such as low thermal expansion property, heat resistance, electric characteristics, etc. The thickness of the layer containing the thermoplastic polyimide is preferably smaller than that of the non-thermoplastic polyimide film, more preferably ½ or less and most preferably ⅕ or less than that of the non-thermoplastic polyimide film. In the present invention, in some cases, surface irregularity is formed on the thermoplastic polyimide resin by surface treatment. In this case, the thickness of the layer containing the thermoplastic polyimide rein is preferably larger than at least the surface roughness Rz of the surface of the thermoplastic polyimide resin roughened by surface treatment, and preferably at least 2 times the surface roughness Rz. For example, when the layer containing the thermoplastic polyimide resin formed on one of the surfaces of the non-thermoplastic polyimide film having a thickness of 25 μm has a surface roughness Rz of 3 μm, the thickness of the layer containing the thermoplastic polyimide resin is preferably 25 μm, more preferably 12.5 μm, and most preferably about 6 μm. The thickness of the non-thermoplastic polyimide film, and the surface roughness Rz and thickness of the layer containing the thermoplastic polyimide resin formed thereon can be appropriately controlled in a range which does not impair the advantage of the present invention.

In the present invention, the copper foil layer in the laminate comprising the layer containing the surface-treated thermoplastic polyimide resin, the non-thermoplastic polyimide film, and the copper foil layer may be formed by bonding directly to a copper foil having irregularity or bonding to a copper foil with an appropriate adhesive. Instead of the copper foil layer, a copper layer formed by wet plating may be used. The bonding of the polyimide film and the copper foil with an adhesive can be performed by a known method such as thermal lamination, thermal pressing, or the like.

Next, description will be made of the adhesive layer in the laminate comprising the layer containing the surface-treated thermoplastic polyimide resin, the layer containing the non-thermoplastic polyimide, and the adhesive layer. Any ordinary adhesive resin can be used as the adhesive, and a known technique which can realize proper resin flowability and high adhesiveness can be used. The adhesive resins used as the adhesive can be roughly divided into the two types including a hot-melt adhesive type using a thermoplastic resin and a thermosetting adhesive type utilizing curing reaction of a thermosetting resin.

Examples of a thermoplastic resin which imparts hot-melt adhesive property to the adhesive include polyimide resins, polyamide-imide resins, polyetherimide resins, polyamide resins, polyester resins, polycarbonate resins, polyketone resins, polysulfone resins, polyphenylene ether resins, polyolefin resins, polyphenylene sulfide resins, fluorocarbon resins, polyarylate resins, and liquid crystal polymer resins. These resins can be used alone or in combination of two or more as the adhesive for the laminate of the present invention. In particular, thermoplastic polyimide resins are preferably used from the viewpoint of excellent heat resistance, electric reliability, and the like. The polyimide resin can be produced using one of known acid dianhydrides or combination of two or more thereof.

In order to exhibit particularly excellent hot-melt adhesive property, ethylenebis(trimellitic acid monoester anhydride), 2,2-bis(4-hydroxyphenyl)propane dibenzoate, 3,3',4,4'-tetracarboxylic dianhydride, 1,2-ethylenebis(trimellitic acid monoester anhydride), 4,4'-hexafluoroisopropylidenediphthalic anhydride, 2,3,3',4'-biphenyltetracarboxylic dianhydride, 3,3',4,4'-biphenyltetracarboxylic dianhydride, 4,4'-oxydiphthalic anhydride, 3,3',4,4'-benzophenonetetracarboxylic dianhydride, or 4,4'-(4,4'-isopropylidenediphenoxy) bis(phthalic anhydride) is preferably used.

As the diamine component, known diamines can be used, and the diamines can be used alone or in combination of two or more. The thermoplastic polyimide resin used for the laminate of the present invention is preferably produced using 1,3-bis(3-aminophenoxy)benzene, 3,3'-dihydroxybenzidine, or bis(4-(3-aminophenoxy)phenyl)sulfone. These compounds can be used alone or in a mixture at a desired ratio.

Next, the curable adhesive utilizing curing reaction of the thermosetting resin will be described below. Examples of the thermosetting resin include bismaleimide resins, bisallylnadiimide resins, phenol resins, cyanate resins, epoxy resins, acrylic resins, methacrylic resins, triazine resins, hydrosilyl curable resins, allyl curable resins, and unsaturated polyester resins. These resins can be used alone or in appropriate combination. Besides the thermosetting resins, a reactive side chain group-containing thermosetting polymer having a reactive group such as an epoxy group, an allyl group, a vinyl group, an alkoxysilyl group, a hydrosilyl group, a hydroxyl group, or the like at the side chain or end of the polymer chain can be used as the thermosetting component. In order to improve the flowability of the adhesive during heat bonding, the thermosetting resin can be mixed with the thermoplastic resin. In this case, the thermosetting resin is preferably added in an amount of 1 to 10,000 parts by weight and preferably 5 to 2,000 parts by weight, relative to 100 parts by weight of the thermoplastic resin. When the amount of the thermosetting resin exceeds 10,000 parts by weight, the adhesive layer may become brittle. On the other hand, when the amount is less than 1 part by weight, the flowability of the adhesive may decrease, or the adhesiveness may decrease.

As the adhesive for the laminate of the present invention, a polyimide resin, an epoxy resin, a cyanate ester resin, or a blend thereof can be preferably used from the viewpoint of adhesiveness, processability, heat resistance, flexibility, dimensional stability, low dielectric properties, cost, etc.

In the present invention, the material and the laminate in any of various forms, each containing the thermoplastic polyimide resin, contain the thermoplastic polyimide resin characterized by being surface-treated. However, surface treatment may be performed beforehand on the material or laminate in any of various forms, which contains the thermoplastic polyimide resin, or may be performed during manufacturing process of the printed wiring board. For example, the thermoplastic polyimide resin of the material or laminate containing the thermoplastic polyimide resin may be subjected to surface treatment, such as "surface treatment for forming surface irregularity" and/or "surface treatment for partially removing the surface layer". Alternatively, in the present invention, the material containing the thermoplastic polyimide resin before surface treatment or the laminate having the material containing the thermoplastic polyimide resin before surface treatment may be used for, for example, manufacturing a printed circuit board, and then subjected to surface treatment during the manufacturing process. These materials and laminates containing the thermoplastic polyimide resin are included in the category of the present invention. More specifically, for example, when a printed wiring board is manufactured using the three-layer structure laminate comprising the surface-treated thermoplastic polyimide resin, the non-thermoplastic polyimide film, and the adhesive layer, a laminate having a structure comprising a metal foil, a thermoplastic polyimide resin film, a non-thermoplastic polyimide film, and an adhesive layer, i.e., a laminate comprising a metal foil having surface irregularity, is also included in the category of the laminate of the present invention. In this case, the laminate comprising the metal foil, the thermoplastic polyimide resin film, the non-thermoplastic polyimide film, and the adhesive layer is laminated on an inner substrate having an inner circuit so that the adhesive layer faces the inner substrate, and then the metal foil is removed by etching or the like to perform surface treatment of the thermoplastic polyimide resin. In another specific example in which a laminate comprising a surface-treated thermoplastic polyimide resin film, a non-thermoplastic polyimide film, and a surface-treated thermoplastic polyimide resin film is used for manufacturing a printed wiring board, a laminate comprising a surface-untreated thermoplastic polyimide resin film, i.e., a laminate comprising a surface-untreated thermoplastic polyimide resin film, a surface-untreated non-thermoplastic polyimide film, and a thermoplastic polyimide resin film may be used. This laminate is also included in the category of the laminate of the present invention. In this case, via holes are formed in the laminate comprising the surface-untreated thermoplastic polyimide resin film, the surface-untreated non-thermoplastic polyimide film, and the thermoplastic polyimide resin film by laser, punching, drilling, or the like so that the via holes pass through the laminate, and then the laminate is surface-treated with, for example, a permanganate solution to perform surface treatment of the thermoplastic polyimide resin. In this case, preferably, desmearing of the via holes and surface treatment are simultaneously performed.

According to a second embodiment of the present invention, a laminate comprises a polymer film and a layer formed on at least one of the surface of the polymer film, and the layer comprises a polyimide resin composition containing a thermoplastic polyimide resin and a thermosetting component. In this laminate, the layer comprising the polyimide resin composition containing the thermoplastic polyimide resin and the thermosetting component permits strong bonding to a metal layer formed on its surface. Even when a metal foil is laminated on an inner wiring board at low pressure and then removed from the surface thereof in a process for manufacturing a printed wiring board, the surface shape of the metal foil can be sufficiently transferred because of the presence of the polymer film. As a result, the degree of freedom of lamination conditions can be increased.

The thermoplastic polyimide resin of the present invention is preferably soluble. In the present invention, the term "soluble" means a solubility of 1% by weight or more in at least one solvent selected from dioxolan, dioxane, tetrahydrofuran, N,N-dimethylformamide, N,N-dimethylacetamide, N-methyl-2-pyrrolidone, and the like at a temperature range from room temperature to 100° C.

The thermoplastic polyimide resin used in the present invention has a structure represented by formula (2). The content of the structure represented by formula (2) is preferably 50 mol %.

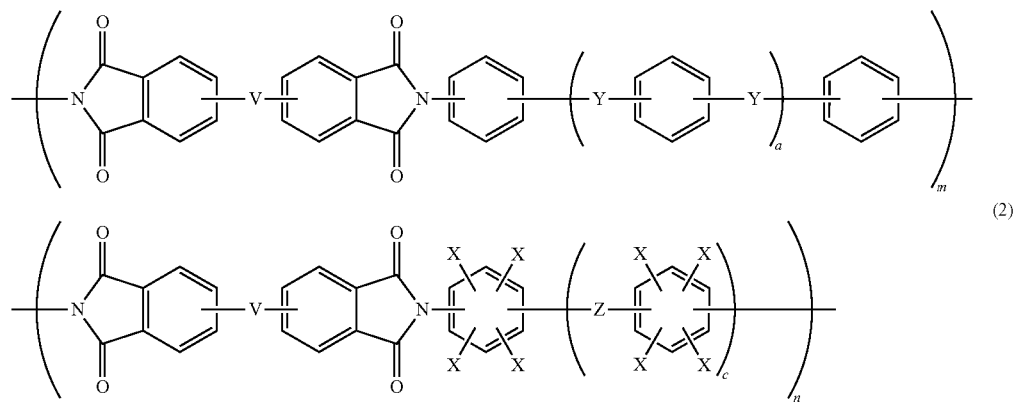

(2)

The thermoplastic polyimide resin can be produced by dehydration and ring closure of a polyamic acid polymer which is produced by reaction between an acid dianhydride represented by formula (3) and a diamine component represented by formula (4).

Formula (3)

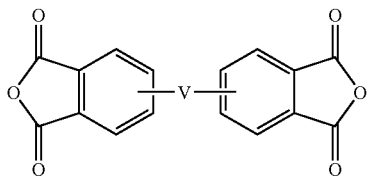

(wherein V represents —O—, —O-T-O—, or —C(=O)—O-T-O—(C=O)—, and T represents a divalent organic group).

Formula (4)

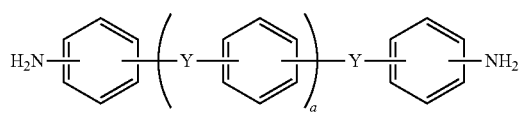

(wherein Y represents —C(=O)—, —SO$_2$—, —O—, —S—, —(CH$_2$)$_b$—, —NHCO—, —C(CH$_3$)$_2$—, —C(CF$_3$)$_2$—, —C(=O)O—, or a single bond, and a and b independently represent an integer of 0 to 5).

The content of the acid dianhydride represented by formula (3) is preferably 50 mol % or more of a total of acid anhydrides. The use of the thermoplastic polyimide resin having such a structure has the effect of sufficiently increasing the adhesive strength between a microcircuit formed by a semi-additive method and a polyimide resin composition layer comprising the thermoplastic polyimide resin and the thermosetting component even when the polyimide resin composition layer has a surface roughness Rz of 3 μm or less.

Also, an expensive process such as vapor deposition, sputtering, or the like is not required.

Examples of T in formula (3) include the following:

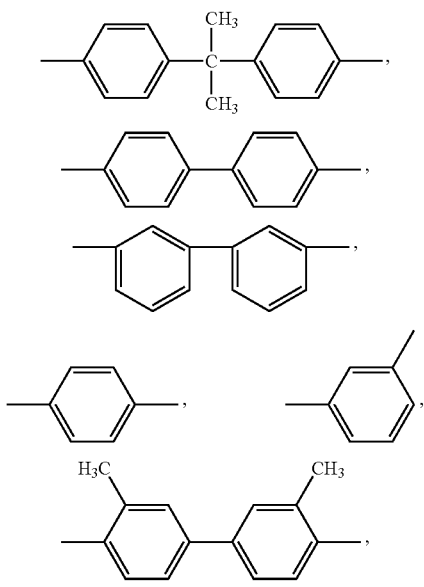

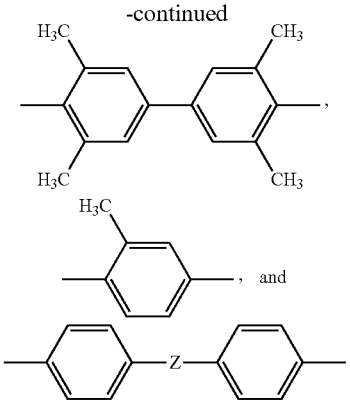

(wherein Z represents a divalent group selected from the group consisting of —C$_Q$H$_{2Q}$—, —C(=O)—, —SO$_2$—, —O—, and —S—; and Q represents an integer of 1 to 5). Preferably, at least one acid dianhydride is selected from the group consisting of the acid dianhydrides represented by formula (3).

The acid dianhydrides represented by formula (3) can be used alone or in combination of two or more. In formula (3), each benzene ring may contain a hydrocarbon group such as a methyl group or an ethyl group, or a halogen group such as Br or Cl.

Specific examples of the acid dianhydrides represented by formula (3) include 4,4'-oxydiphthalic anhydride, 3,4'-oxydiphthalic anhydride, 3,3'-oxydiphthalic anhydride, 4,4'-(4,4'-isopropylidenediphenoxy)bis(phthalic anhydride), 4,4'-hydroquinonebis(phthalic anhydride), 2,2-bis(4-hydroxyphenyl)propanedibenzoate-3,3',4,4'-tetracarboxylic dianhydride, 1,2-ethylenebis(trimellitic acid monoester anhydride), p-phenylenebis(trimellitic acid monoester anhydride), 4,4'-biphenylenebis(trimellitic acid monoester anhydride), 1,4-naphthalenebis(trimellitic acid monoester anhydride), 1,2-ethylenebis(trimellitic acid monoester anhydride), 1,3-trimethylenebis(trimellitic acid monoester anhydride), 1,4-tetramethylenebis(trimellitic acid monoester anhydride), 1,5-pentamethylenebis(trimellitic acid monoester anhydride), and 1,6-hexamethylenebis(trimellitic acid monoester anhydride). These anhydrides can be used alone or in combination. Among these anhydrides, 4,4'-(4,4'-isopropylidenediphenoxy) bis(phthalic anhydride), 2,2-bis(4-hydroxyphenyl)propanedibenzoate-3,3',4,4'-tetracarboxylic dianhydride, and 1,2-ethylenebis(trimellitic acid monoester anhydride) can produce thermoplastic polyimide resins having excellent solubility and heat resistance. These acid dianhydrides are particularly preferred because they can produce thermoplastic polyimide resins having a suitable glass transition temperature and a good balance among characteristics such as low water absorption, heat resistance such as resistance to thermal decomposition, and the like.

Furthermore, another acid dianhydride can be combined with that represented by formula (3) in a range which does not impair the advantage of the present invention. Specifically, known tetracarboxylic dianhydrides can be used. Examples of the tetracarboxylic dianhydrides include aromatic tetracarboxylic dianhydrides such as pyromellitic dianhydride, 3,3',4,4'-benzophenonetetracarboxylic dianhydride, 3,3',4,4'-diphenylsulfonetetracarboxylic dianhydride, 1,4,5,8-naphthalenetetetracarboxylic dianhydride, 2,3,6,7-naphthalenetetetracarboxylic dianhydride, 3,3',4,4'-dimethyldiphenylsilanetetracarboxylic dianhydride, 3,3',4,4'-tetraphenylsilanetetracarboxylic dianhydride, 1,2,3,4- furantetracarboxylic dianhydride, 4,4'-bis(3,4-dicarboxyphenoxy)diphenylpropane dianhydride, 4,4'-hexafluoroisopropylidenediphthalic anhydride, 3,3',4,4'-biphenyltetracarboxylic dianhydride, 2,3,3',4'-biphneyltetracarboxylic dianhydride, and p-phenylenediphthalic anhydride; and 4,4'-hexafluoroisopropylidenediphthalic anhydride.

Next, the diamine component will be described. It is essential to use the diamine component represented by formula (4):

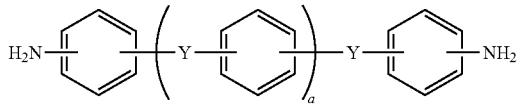

(wherein Y represents —C(=O)—, —SO$_2$—, —O—, —S—, —(CH$_2$)$_b$—, —NHCO—, —C(CH$_3$)$_2$—, —C(CF$_3$)$_2$—, —C(=O)O—, or a single bond, and a and b independently represent an integer of 0 to 5).

Diamines represented by formula (4) can be used alone or in combination of two or more. In formula (3), a plurality of Y's between respective repeat units may be the same or different, and each benzene ring may contain a hydrocarbon group such as a methyl group or an ethyl group, or a halogen group such as Br or Cl.

Furthermore, the diamine compounds represented by formula (4) preferably have amino groups at the meta position because they can produce thermoplastic polyimide resins having higher solubility than those produced from diamine compounds having amino groups at the para position.

By using a diamine compound having amino groups at the meta position, the effect of improving the solubility of the thermoplastic polyimide resin of the present invention can be expected. However, the content of such a diamine compound is preferably 50 to 100 mol % and more preferably 80 to 100 mol % relative to a total of diamine components.

Examples of the diamine compounds represented by formula (4) include 4,4'-diaminodiphenyl ether, 3,4'-diaminodiphenyl ether, 3,3'-diaminodiphenyl ether, 4,4'-diaminodiphenyl thioether, 3,4'-diaminodiphenyl thioether, 3,3'-diaminodiphenyl thioether, 3,3'-diaminodiphenylmethane, 3,4'-diaminodiphenylmethane, 4,4'-diaminodiphenylmethane, 4,4'-diaminodiphenylsulfone, 3,4'-diaminodiphenylsulfone, 3,3'-diaminodiphenylsulfone, 4,4'-diaminobenzanilide, 3,4'-diaminobenzanilide, 3,3'-diaminobenzanilide, 4,4'-diaminobenzophenone, 3,4'-diaminobenzophenone, 3,3'-diaminobenzophenone, bis[4-(3-aminophenoxy)phenyl]methane, bis[4-(4-aminophenoxy)phenyl]methane, 1,1-bis[4-(3-aminophenoxy)phenyl]ethane, 1,1-bis[4-(4-aminophenoxy)phenyl]ethane, 1,2-bis[4-(3-aminophenoxy)phenyl]ethane, 1,2-bis[4-(4-aminophenoxy)phenyl]ethane, 2,2-bis[4-(3-aminophenoxy)phenyl]propane, 2,2-bis[4-(4-aminophenoxy)phenyl]propane, 2,2-bis[4-(3-aminophenoxy)phenyl]butane, 2,2-bis[3-(3-aminophenoxy)phenyl]-1,1,1,3,3,3-hexafluoropropane, 2,2-bis[4-(4-aminophenoxy)phenyl]-1,1,1,3,3,3-hexafluoropropane, 1,3-bis(3-aminophenoxy)benzene, 1,4-bis(3-aminophenoxy)benzene, 1,4'-bis(4-aminophenoxy)benzene, 4,4'-bis(4-aminophenoxy)biphenyl, bis[4-(3-aminophenoxy)phenyl]ketone, bis[4-(4-aminophenoxy)phenyl]ketone, bis[4-(3-aminophenoxy)phenyl]sulfide, bis[4-(4-aminophenoxy)phenyl]sulfide, bis[4-(3-aminophenoxy)phenyl]sulfone, bis[4-(4-aminophenoxy)phenyl]sulfone, bis[4-(3-aminophenoxy)phenyl]ether, bis[4-(4-aminophenoxy)phenyl]ether, 1,4-bis[4-(3-aminophenoxy)benzoyl]benzene, 1,3-bis[4-(3-aminophenoxy)benzoyl]benzene, 4,4'-bis[3-(4-aminophenoxy)benzoyl]diphenyl ether, 4,4'-bis[3-(3-aminophenoxy)benzoyl]diphenyl ether, 4,4'-bis[4-(4-amino-α,α-dimethylbenzyl)phenoxy]benzophenone, 4,4'-bis[4-(4-amino-α,α-dimethylbenzyl)phenoxy]diphenylsulfone, bis[4-{4-(4-aminophenoxy)phenoxy}phenyl]sulfone, 1,4-bis[4-(4-aminophenoxy)-α,α-dimethylbenzyl]benzene, and 1,3-bis[4-(4-aminophenoxy)-α,α-dimethylbenzyl]benzene.

Examples of the diamine compounds represented by formula (3) in which amino groups are present at the meta position include 1,1-bis[4-(3-aminophenoxy)phenyl]ethane, 1,2-bis[4-(3-aminophenoxy)phenyl]ethane, 2,2-bis[4-(3-aminophenoxy)phenyl]propane, 2,2-bis[4-(3-aminophenoxy)phenyl]butane, 2,2-bis[3-(3-aminophenoxy)phenyl]-1,1,1,3,3,3-hexafluoropropane, 1,3-bis(3-aminophenoxy)benzene, 1,4-bis(3-aminophenoxy)benzene, bis[4-(3-aminophenoxy)phenyl]ketone, bis[4-(3-aminophenoxy)phenyl]sulfide, bis[4-(3-aminophenoxy)phenyl]sulfone, bis[4-(3-aminophenoxy)phenyl]ether, 1,4-bis[4-(3-aminophenoxy)benzoyl]benzene, 1,3-bis[4-(3-aminophenoxy)benzoyl]benzene, and 4,4'-bis[3-(3-aminophenoxy)benzoyl]diphenyl ether. Besides the diamine compounds represented by formula (4), m-phenylenediamine, o-phenylenediamine, p-phenylenediamine, m-aminobenzylamine, p-aminobenzylamine, and the like can be used.

Also, a reactive diamine represented by formula (5) can be preferably used.

Formula (5)

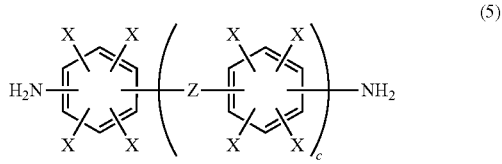

(wherein Z represents —C(=O)—, —SO$_2$—, —O—, —S—, —(CH$_2$)$_d$—, —NHCO—, —C(CH$_3$)$_2$—, —C(CF$_3$)$_2$—, —C(=O)O—, or a single bond, c and d independently represent an integer of 0 to 5, and X's each represent an independent functional group containing at least one functional group selected from —OH, —COOH, —OCN, and —CN).

The diamines represented by formula (4) can be used alone or in combination of two or more. In formula (5), a reactive functional group bonded to each benzene ring is an essential component, and a hydrocarbon group such as a methyl group or an ethyl group, or a halogen group such as Br or Cl may be further incorporated.

Examples of the diamines represented by formula (5) include 3,3'-dihydroxy-4,4'-diaminobiphenyl and 3,5-diaminobenzoic acid. For example, the thermoplastic polyimide resin produced using 3,3'-dihydroxy-4,4'-diaminobiphenyl contains hydroxyl groups, and thus has reactivity to an epoxy compound, a cyanate ester compound, or the like serving as the thermosetting component. Therefore, in the polyimide resin composition containing the thermoplastic polyimide resin and the thermosetting component according to the present invention, crosslinking proceeds to improve the heat resistance of the polyimide resin composition. Since the use of an excess of reactive diamine may degrade the solubility of the resulting polyimide resin, the content of the reactive diamine is preferably 0 to 50 mol % and more preferably 0 to 20 mol %.

For example, the hydroxyl groups in the thermoplastic polyimide resin produced by reaction between the diamine component having an hydroxyl group and the acid dianhydride may be converted to cyanate ester groups by reaction with cyanogen bromide to produce a cyanate ester-modified polyimide resin having reactivity.

The thermoplastic polyimide resin can be produced by dehydration and ring closure of the corresponding polyamic acid polymer. The same synthetic method for the polyamic acid and the same imidization method as described above can be used.

The resulting thermoplastic polyimide resin has a relatively low glass transition temperature. Thereby, in the present invention, in order that the resin composition has excellent processing properties, the glass transition temperature of the thermoplastic polyimide resin is preferably 350° C. or less, more preferably 320° C. or less, and most preferably 280° C. The lower limit of the glass transition temperature is not particularly limited, but the lower limit is preferably 150° C. or more and more preferably 170° C. or more.

Next, the thermosetting component according to the present invention will be described. By adding an appropriate amount of the thermosetting component to the thermoplastic polyimide resin, the surface of the metal foil can be satisfactorily transferred in the process for laminating the metal foil, the laminate of the present invention, and the inner wiring board. This causes the effect of improving adhesive strength to the microcircuit formed by the semi-additive method. Thereto after curing, the transferred surface shape can be maintained in subsequent steps, and thereby the effect of maintaining adhesive strength to the microcircuit formed by the semi-additive method is increased. The thermosetting component will be specifically described. Examples of the thermosetting component include bismaleimide resins, bisallylnadiimide resins, phenol resins, cyanate ester resins, epoxy resins, acrylic resins, methacrylic resins, triazine resins, hydrosilyl curable resins, allyl curable resins, and unsaturated polyester resins or the like. These resins can be used alone or in proper combination. Among these resins, epoxy resins and cyanate ester resins are preferred because the well-balanced resin composition can be produced.

In the present invention, any epoxy resin can be used. Usable examples of the epoxy resins include bisphenol epoxy resins, halogenated bisphenol epoxy resins, phenolic novolac epoxy resins, halogenated phenolic novolac epoxy resins, alkylphenolic novolac epoxy resins, polyphenolic epoxy resins, polyglycol epoxy resins, alicyclic epoxy resins, cresol novolac epoxy resins, glycidylamine epoxy resins, urethane-modified epoxy resins, rubber-modified epoxy resins, and epoxy-modified polysiloxane or the like.

In the present invention, any cyanate ester resin can be used. Examples of the cyanate ester resins include 2,2'-dicyanatodiphenylmethane, 2,4'-dicyanatodiphenylmethane, 4,4'-dicyanatodiphenylmethane, bis(3-methyl-4-cyanatophenyl)methane, bis(3,5-dimethyl-4-cyanatophenyl)methane, bis(3,5-dibromo-4-cyanatophenyl)methane, bis(3,5-dichloro-4-cyanatophenyl)methane, 2,2-bis(4-cyanatophenyl)propane, 2,2-bis(3,5-dimethyl-4-cyanatophenyl)propane, 2,2-bis(3-methyl-4-cyanatophenyl)propane, 4,4'-dicyanatodiphenyl ether, 4,4'-dicyanatodiphenyl thioether, 2,2-bis(4-cyanatophenyl)perfluoropropane, 1,1-bis(4-cyanatophenyl)ethane, 2,2-bis(3,5-dichloro-4-cyanatophenyl)propane, and 2,2-bis(3,5-dibromo-4-cyanatophenyl)propane. Among these compounds, 4,4'-dicyanatodiphenylmethane, 2,2-bis(4-cyanatophenyl)propane, bis(3,5-dimethyl-4-cyanatophenyl)methane, 4,4'-dicyanatodiphenyl thioether, 2,2-bus(4-cyanatophenyl)perfluoropropane, 1,1-bis(4-cyanatophenyl)ethane, and 2,2-bis(3,5-dibromo-4-cyanatophenyl)propane are preferred, and 4,4'-dicyanatodiphenylmethane, and 2,2-bis(3,5-dibromo-4-cyanatophenyl)propane are more preferred.

Furthermore, a curing catalyst is preferably used, but the curing catalyst need not necessarily be used. As the curing catalyst, an imidazole, a tertiary amine, an organometallic compound, or the like can be used. In particular, the organometallic compound is preferred, and for example, cobalt octylate, zinc octylate, cobalt naphthenate, zinc naphthenate, or the like can be used. In addition, nonvolatile phenol is preferably used for accelerating curing reaction. Examples of the nonvolatile phenol include bisphenols such as bisphenol A, bisphenol F, and bisphenol S; and nonylphenol.

The mixing ratio between the thermoplastic polyimide resin and the thermosetting component in the polyimide resin composition of the present invention is 100 parts by weight: 1 to 10,000 parts by weight, and more preferably 100 parts by weight: 5 to 2,000 parts by weight in the weight of thermoplastic polyimide resin and the thermosetting component each. With an excessively small amount of the thermosetting component, the shape transferred from the metal foil cannot be maintained, and thus the transferred shape cannot be maintained in subsequent steps, thereby failing to maintain the adhesive strength to the microcircuit formed by the semi-additive method. In contrast, with an excessively large amount, the adhesive strength itself between the polyimide resin composition layer and the microcircuit formed by the semi-additive method may be degraded.

The inventors found that the polyimide resin composition containing the thermoplastic polyimide resin and the thermosetting component according to the present invention has high electrical insulation. Although the circuit width and space width on a printed circuit board have decreased more and more, conventional materials have low insulation resistance and thus have difficulty in maintaining sufficient insulation. The polyimide resin composition of the present invention has high insulation resistance, and preferably has a volume resistivity of $5\times10^{12}$ Ω·cm or more, and more preferably $1\times10^{15}$ Ω·cm or more. The resistivity was measured according to ASTM D-257. It was also found that the polyimide resin composition of the present invention has a low dielectric constant and a low dielectric loss tangent. As the clock frequency of a semiconductor increases, a wiring board material is required to have a smaller signal delay in the GHz band, a lower transmission loss, i.e., a lower dielectric constant and a lower dielectric loss tangent. The relative dielectric constant is preferably 3.5 or less, and the dielectric loss tangent is preferably 0.015 or less.

Next, the polymer film used in the laminate of the present invention will be described. In the present invention, the polyimide resin composition layer comprising the thermoplastic polyimide resin and the thermosetting component is formed on the polymer film. Even when the polyimide resin composition layer has a surface roughness Rz of 3 μm or less, the adhesive strength between the resin composition layer and the microcircuit formed by the semi-additive method is sufficiently high. Also, since the microcircuit is not formed directly on the polymer film of the present invention, adhesive force between the polymer film and the microcircuit is not required. Furthermore, the polymer film of the present invention need not be passed directly through an expensive process such as vapor deposition, sputtering, or the like. Furthermore, the laminate of the present invention comprises the polymer film with high rigidity, and thus the surface of the metal foil can be satisfactorily transferred even by lamination under low pressure. Therefore, the degree of freedom of lamination conditions can be increased.

A material used for the polymer film of the present invention preferably has excellent dimensional stability, heat resistance, and mechanical properties. Examples of the polymer film include films of polyolefins such as polyethylene, polypropylene, and polybutene; ethylene-vinyl alcohol copolymers; polystyrene; polyesters such as polyethylene terephthalate, polybutylene terephthalate, and ethylene-2,6-naphthalate; nylon-6; nylon-11; aromatic polyamides; polyamide-imide resins; polycarbonates; polyvinyl chloride; polyvinylidene chloride; polyketone resins; polysulfone resins; polyphenylenesulfide resins; polyetherimide resins; fluorocarbon resins; polyarylate resins; liquid crystal polymer resins; polyphenylene ether resins; and polyimide resins.

In the present invention, in order to impart sufficient rigidity to the laminate, the polymer film preferably has a tensile modulus of 5 GPa or more and more preferably 6 GPa or more.

Furthermore, since thermal stability is required in processing the printed wiring board, the polymer film is required to have dimensional stability. Therefore, the polymer film preferably has a coefficient of linear expansion of $2.0 \times 10^{-5}/°C$. or less, more preferably $1.5 \times 10^{-5}/°C$. or less, and most preferably $1 \times 10^{-5}/°C$. or less.

The polymer film is also required to have sufficient adhesive force to the polyimide resin composition layer comprising the thermoplastic polyimide resin and the thermosetting composition.

As the film satisfying the above-described properties, the same as the non-thermoplastic polyimide resin film can be used.

Next, the adhesive layer constituting the laminate of the present invention will be described. The adhesive layer is laminated on the side opposite to the layer comprising the polyimide resin composition.

Like in the above-described adhesive layer, adhesives for the adhesive layer include the two types, i.e., a heat seal-type adhesive utilizing a thermoplastic resin, and a curable adhesive utilizing curing reaction of a thermosetting resin.

The laminate of the present invention comprises the polymer film and the layer comprising the polyimide resin composition containing the thermoplastic polyimide resin and the thermosetting component, provided on one of the surfaces thereof. The laminate of the present invention may comprise the layers provided on both surfaces thereof, each of the layers comprising the polyimide resin composition. In this case, the compositions of the layers each comprising the polyimide resin composition may be the same or different. The laminate of the present invention may comprise a layer comprising the polyimide resin composition provided on one of the surfaces and an adhesive layer provided on the other surface.

By using the polyimide resin composition, the laminate of the present invention is characterized in that the microcircuit formed by the semi-additive method and the polyimide resin composition layer are strongly bonded together even when the resin composition layer has a surface roughness Rz is 3 μm or less. Therefore, in view point of cost an expensive process such as vapor deposition, sputtering, or the like is not required.

Furthermore, a protective film may be provided on one or both of the surfaces of the laminate of the present invention, for preventing curling, surface contamination, flaw, and the like.

In lamination using the laminate of the present invention, a metal foil is used. The type of the metal foil is not particularly limited. Specifically, a copper foil, an aluminum foil, a nickel foil, or the like is preferably used, but a copper foil generally used in manufacture of printed wiring boards is more preferred. After lamination, the metal foil over the entire surface is etched to expose the surface of the polyimide resin to which the surface of the metal foil is transferred. Then, the surface is subjected to chemical plating. As described above, in order to form the microcircuit with high adhesive strength, the surface roughness Rz of the metal foil is preferably 3 μm or less and more preferably 2 μm or less. The surface roughness Rz is preferably about 0.1 times or less the width of the circuit formed, for obtaining a satisfactory circuit shape.

The metal foil can be laminated by a method accompanied with heating and/or pressing. Although hydraulic pressing, vacuum pressing, or vacuum lamination can be used, vacuum pressing or vacuum lamination is preferred from the viewpoint of air-foaming and embedding property of an inner circuit. The maximum lamination temperature is 300° C. or less, preferably 250° C. or less, and more preferably 200° C. or less. The lamination time is about 1 minute to 3 hours and preferably 1 minute to 2 hours. In vacuum pressing or vacuum lamination, the pressure in a chamber is 10 kPa or less and preferably 1 kPa or less. Since the laminate of the present invention comprises the polymer film with high rigidity, the surface of the metal foil can be satisfactorily transferred even by laminating under lower pressure, thereby increasing the degree of freedom of lamination conditions. The lamination pressure is preferably 0.5 MPa or more and more preferably 0.7 MPa or more. Under a pressure of less than 0.5 MPa, the surface of the metal foil cannot be sufficiently transferred, and thus adhesive strength to a chemically plated film may be decreased. After lamination, the resulting laminate can be placed in a curing furnace such as a hot-air oven or the like. In this case, thermal curing reaction of the polyimide resin composition can be accelerated in the curing furnace. In particular, when the lamination time is decreased to, preferably, 20 minutes or less, use of the curing furnace is preferred from the viewpoint of improved productivity. For example, when the printed wiring board is produced by the semi-additive method, the lamination time can be decreased to 20 minutes or less in view of productivity. In this case, the metal foil over the entire surface can be removed before curing reaction of the polyimide resin composition is completed, and then thermal curing reaction can be accelerated in the curing oven. This method permits curing reaction in the curing furnace without foaming and is thus preferred for a case in which the polyimide resin composition contains a large amount of solvent residue.

Next, the process for removing the metal foil from the surface will be described. The method for removing the metal foil from the surface is not particularly limited, but etching is preferred. The metal foil is preferably etched with an etchant selected according to the type of the metal foil. For a copper foil, an aluminum foil, a nickel foil, or the like which can be preferably used as the metal foil, a generally available ferric chloride etchant or cupric chloride etchant, or the like is preferably used. Although the etching time and etching temperature are not particularly limited, the etching temperature is preferably 10° C. or more in view of productivity. After the metal foil is removed from the surface, the laminate can be placed in a curing furnace such as a hot-air oven or the like. As described above, in this case, curing reaction can be performed in the curing furnace without foaming when the polyimide resin composition contains a large amount of solvent residue.

The polyimide resin composition layer in the laminate of the present invention may be in a semi-cured state or a cured state, or may be subjected to surface treatment for forming irregularity by a method such as embossing, sand blasting, polishing, or the like. However, in the process for manufacturing the printed circuit board according to the present invention, the surface of the metal foil can be transferred to the surface of the layer of the present invention by laminating the laminate and the metal foil under heating and/or pressing, and thus the circuit formed on the layer and the layer can be strongly bonded together. Therefore, the layer is preferably in a semi-cured state, particularly, without irregularity.

Any one of the laminates of the present invention comprises the polymer film and the polyimide resin composition layer formed thereon, the layer comprising the thermoplastic polyimide resin and the thermosetting component. The polyimide resin composition layer in the laminate of the present invention is preferably as thin as possible for making use of the physical properties of the polymer film having excellent characteristics as a circuit substrate, such as low thermal expansion, heat resistance, electric characteristics, etc. The thickness of the polyimide resin composition layer is preferably smaller than that of the polymer film, more preferably ½ or less, and most preferably ⅕ or less, of that of the polymer film.

The laminate of the present invention can also be produced by a method in which a polyimide resin composition solution, which is prepared by dissolving the polyimide resin composition containing the thermoplastic polyimide resin and the thermosetting component in at least one solvent, is applied to the polymer film of the invention by a known general coating method such as die coating, knife coating, gravure coating, or the like, and then dried at a temperature where curing reaction does not excessively proceed. The solvent is not particularly limited as long as it dissolves the thermoplastic polyimide resin and the thermosetting component. However, the type and amount of the solvent are preferably determined so as to suppress the amount of volatile residue in the formed polyimide resin composition layer to 10% by weight or less and more preferably 7% by weight or less. In addition, the drying temperature and time must be appropriately set. With a volatile residue exceeding 10% by weight or more, foaming undesirably occurs in a heating step for manufacturing the printed circuit board or a solder reflow step for mounting a part on the manufactured printed circuit board. In view of economics and workability, a low-boiling-point solvent having a boiling point of 160° C. or less is preferred. The solvent more preferably has a boiling point of 130° C. or less and most preferably a boiling point of 105° C. or less. Preferred examples of such a low-boiling-point solvent include tetrahydrofuran (abbreviated to "THF" hereinafter, boiling point 66α C.), 1,4-dioxane (abbreviated to "dioxane" hereinafter, boiling point 103° C.), monoglyme (boiling point 84° C.), dioxolane (boiling point 76° C.), and dimethoxyethane (boiling point 85° C.). These solvents can be used alone or in combination of two or more.

In addition, the polyimide resin composition solution may be combined with an ordinary epoxy curing agent such as an acid anhydride, e.g., an acid dianhydride, an amine, imidazole, or the like, an accelerator, any one of various coupling agents, according to the purposes for improving water absorption, heat resistance, adhesiveness, and the like.

In producing the laminate comprising the polyimide resin composition layers provided on both surfaces of the polymer film of the present invention, both layers can be formed as described above, and then dried at a temperature where curing reaction does not excessively proceed. Alternatively, one of the layers can be formed by the above-described method, surface-treated, and cured, and then the other layer can be formed, followed by drying at a temperature where curing reaction does not excessively proceed. In this method, the compositions of the polyimide resin composition layers may be the same or different. In producing the laminate comprising the polyimide resin composition layer formed on one surface and the adhesive layer formed on the other surface, either of the polyimide resin composition layer and the adhesive layer may be first formed. However, it is important to take care that the adhesive layer must be kept in a semi-cured state.

Furthermore, a sheet of the polyimide resin composition containing the thermoplastic polyimide resin and the thermosetting component can be formed and bonded to the polymer film. The lamination method is not limited.

A resin film according to a third embodiment of the present invention will be described below.

Although the resin used for the resin film of the present invention is not particularly limited, resins such as polyethylene terephthalate, polyethylene naphthalate, aromatic polyamide (aramid), polybenzoxazole, polyimide, and the like are preferred from the viewpoint of excellent heat resistance. Among these resins, polyimide resins are preferred from the viewpoint of an excellent balance between characteristics such as electrical and mechanical properties. In particular, thermoplastic polyimide resins having a glass transition temperature of 150° C. to 300° C. are preferred from the viewpoint of easy formation of fine irregularity. With a glass transition temperature of less than 150° C., the printed wiring board manufactured using the materials of the present invention tends to be degraded in heat resistance. With a glass transition temperature of over 300° C., a high temperature is required for forming fine irregularity, and thus processability tends to deteriorate.

The thermoplastic polyimide resin can be produced by a known method, for example, the above-described imidization method.

As the acid dianhydride, the compounds represented by formula (3) can be used.

The polyimide resin is preferably produced using at least one diamine represented by formula (6):

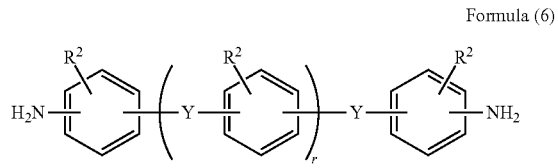

Formula (6)

(wherein Y represents —C(=O)—, —SO$_2$—, —O—, —S—, —(CH$_2$)$_m$—, —NHCO—, —C(CH$_3$)$_2$—, —C(CF$_3$)$_2$—, —C(=O)O—, or a single bond, R$^2$ represents hydrogen, a halogen group, or an alkyl group having 1 to 4 carbon atoms, and m and r each represent an integer of 1 to 5). Thus the polyimide resin perform that the softening point (or glass transition temperature) can be easily controlled, and the polyimide resin having excellent heat resistance and low water absorption can be easily produced.

In order to improve properties such as adhesiveness, heat resistance, processability, and the like, the polyimide resin may be mixed with another resin in a rang which causes no deterioration in the properties such as heat resistance, low hygroscopicity, and the like. Examples of the other resins include thermosetting resins such as epoxy resins, cyanate ester resins, bismaleimide resins, bisallylnadiimide resins, phenol resins, acrylic resins, methacrylic resins, hydrosilyl curable resins, ally curable resins, and unsaturated polyester resins; and reactive side chain group-containing thermosetting polymers each having a reactive group such as an allyl group, a vinyl group, an alkoxysilyl group, or a hydrosilyl group at the side or end of the polymer chain. These resins may be used alone or in appropriate combination.

The resin film of the present invention has a surface shape on at least one surface thereof, the surface shape having an arithmetic mean roughness Ra1 value of 0.05 μm to 1 μm measured with a cutoff value of 0.002 mm, and a Ra1/Ra2 ratio of 0.4 to 1, Ra2 being a value measured with a cutoff value of 0.1 mm.

The arithmetic mean roughness Ra is defined in JIS B0601 (revised on Feb. 1, 1994). In the present invention, particularly, the value of the arithmetic mean roughness Ra is determined by observing the surface with an optical interference-type surface structure analyzer. In the present invention, the term "cutoff value" represents the wavelength determined for obtaining a roughness curve from a sectional curve (observed data) according to JIS B0601. Namely, the Ra value measured with a cutoff value of 0.002 mm means an arithmetic mean roughness calculated from a roughness curve, which is obtained by removing irregularity with wavelengths of 0.002 mm or more from the observed data. Therefore, when there is no irregularity with wavelengths of 0.002 mm or less, the Ra value measured with the cutoff value of 0.002 mm is 0 μm.

A preferred example of the method for forming surface irregularity on the resin is to partially remove the resin by sand blasting, polishing, or the like. When the resin has thermoplasticity, embossing can also preferably be used. In embossing, surface irregularity can be formed on the resin by bringing the resin into contact with a metal material having surface irregularity formed thereon at a temperature higher than the glass transition temperature (softening point) of the resin. The embossing process is preferably accompanied with heating and pressing, and performed under conditions for forming proper irregularity. Another preferred method is a replica method in which the roughened surface of the metal foil is brought into contact with the resin film, and then heated and press-bonded thereto by pressing or the like at a temperature higher than the softening point of the resin, and then the metal foil is peeled by a chemical method or a physical method such as peeling or the like.

In a further method, a mixture of fine particles is mixed in the resin in production of the resin film.

In any one of the above-described methods, sand blasting, or polishing is preferably performed under conditions for forming appropriate irregularity.

In the present invention, any one of the above-described surface treatment methods such as "surface treatment for forming irregularity on the surface of the thermoplastic polyimide resin", "surface treatment for partially removing the surface layer of the thermoplastic polyimide resin", and the like can be used as the surface treatment method.

In any one of the methods, it is important that the arithmetic mean roughness Ra1 value measured with a cutoff value of 0.002 mm is 0.05 μm to 1 μm, and the Ra1/Ra2 ratio to the Ra2 value measured with a cutoff value of 0.1 mm is controlled to 0.4 to 1. The Ra1 value is preferably 0.1 μm to 0.8 μm and more preferably 0.2 μm to 0.6 μm, and the Ra1/Ra2 ratio is 0.5 to 1 and more preferably 0.6 to 1. The Ra2 value indicates irregularity with wavelengths of 100 μm or less. Since the irregularity with wavelengths of over 100 μm possibly includes, at a high ratio, wrinkles and curls occurring in a film at the time of setting of a sample for observing the surface shape, the Ra2 value is set as a value suitable for removing irregularity which is not original irregularity of the film. On the other hand, the Ra1 value indicates irregularity with wavelengths 2 μm or less. The inventors found that as the Ra1 value increases, wiring formability in forming micro-wiring with L/S of 30 μm/30 μm or less and preferably 10 μm/10 μm or less tends to decrease. It was also found that irregularity with wavelengths of 2 μm or less tends to have lower adhesiveness unless it has a certain height, i.e., an arithmetic mean roughness value is 0.05 μm to 1 μm.

Namely, with a Ra1/Ra2 ratio of less than 0.4, the film has a large amount of irregularity with wavelengths of 2 μm to 100 μm and thus has difficulty in forming a microcircuit. Also, with a Ra1/Ra2 ratio of less than 1 but close to 1, a film surface has a large amount of micro-irregularity with wavelengths of 2 μm or less and is thus suitable for forming micro-wiring. Furthermore, with an Ra1 value of less than 0.05 μm, the formed irregularity does not have a sufficient height and thus has lower adhesiveness, while with Ra1 value of over 1 μm, the formed irregularity has an excessively large height and thus has difficulty in forming a microcircuit.

In order to control the surface shape in the above-described range, it is important to form the surface shape under processing conditions suitable for the resin film used.

For example, when the surface of the resin is partially dissolved with a chemical, it is important to select the materials used for processing, such as the type and concentration of the chemical, a combination of a plurality of chemicals, and the like, and the processing conditions such as chemical treatment temperature and treatment time, and the like according to the resin film used. In particular, it is important to combine the materials used for processing and the processing conditions according to the characteristics of the resin film used.

When the resin film has thermoplasticity, micro-irregularity is preferably formed by the embossing or replica method. In the replica method, it is important to appropriately select the materials used for processing, such as the type of the metal used (surface roughness, surface shape, and the like), and processing conditions such as the pressing temperature, pressure, time, and the like. In particular, it is important to combine the materials used for processing and the processing conditions according to the characteristics of the thermoplastic resin film used. When a surface with micro-irregularity is formed on the thermoplastic resin by the embossing or replica method, a metal roll with suitable irregularity and a copper foil are necessarily used respectively. In order to form a suitable surface shape, it is important to properly determine the temperature and pressure during pressing of the metal roll and metal foil on the thermoplastic material.

Specifically, the pressing temperature is in a range of glass transition temperatures of thermoplastic resins, i.e., −100° C. to 180° C., and preferably −50° C. to 150° C., the linear pressure is in a range of 10 kgf/cm to 200 kgf/cm and preferably 20 kgf/cm to 150 kgf/cm, and the processing velocity is in a range of 0.5 m/min to 5 m/min and preferably 1 m/min to 3 m/min. It is important to determine suitable conditions according to the characteristics (flowability in heating, the glass transition temperature, and the elastic modulus in heating) of the thermoplastic resin material used.

The resin film used in the present invention may be a multi-layer resin film for compensating the characteristics of a resin film having a specified surface, which has the properties such as the mechanical properties, heat resistance, processability, and the like. With respect to the multi-layer resin film, the polyimide resin is preferably contained over the entirety of the layer from the viewpoint of an excellent balance between characteristics such as insulating properties, thermal properties, mechanical properties, and the like.

In order to impart a lamination property to the adhesive layer, another resin layer can be formed on the surface opposite to the surface with the surface shape according to the present invention, the layer having a lower softening point or melting point than that of the resin with the surface according to the present invention.

A method for forming a metal layer serving as a conductor layer on the specified surface shape of the resin film according to the present invention is not particularly limited. Examples of the method include wet plating methods such as electroless plating and electroplating, and dry plating methods such as sputtering and vapor deposition.

The wet plating method is preferred from the viewpoint of cost. Alternatively, the metal foil may be bonded to the surface with an adhesive.

Examples of a method for forming an electronic circuit on the specified surface shape on the resin film according to the present invention include a method comprising forming a metal layer over the entire surface and then partially etching the metal layer to form a circuit, and a method comprising forming a plating resist layer on the surface, performing exposure and development, and then laminating a metal layer on the exposed portions of the surface by plating to form a circuit.

Furthermore, a multilayer circuit board can be manufactured using the resin film of the present invention. In a method for manufacturing the multilayer circuit board, the resin film can be used for forming a resin layer on the surface opposite to the surface having the specified surface shape according to the present invention, the resin layer having a lower softening point or melting point than that of the resin having the specified surface shape. Namely, the multilayer circuit board can be manufactured by a method in which the resin layer having a lower softening point or melting point than that of the resin having the specified surface shape is brought into contact with a substrate having a circuit previously formed thereon, and then press-bonded together by pressing or lamination under heating and pressure, and then a circuit is formed on the surface having the specified surface shape.

Next, the method for manufacturing the printed circuit board will be described.

Description will be made of the method for manufacturing the printed circuit board using the laminate of the present invention, i.e., the two-layer structure laminate comprising the resin film and the non-thermoplastic polyimide film or the polymer film; or the three-layer structure laminate comprising the resin film/the non-thermoplastic polyimide film or the polymer film/and the thermoplastic polyimide resin or the resin film, the resin film/the non-thermoplastic polyimide film or the polymer film/and the copper foil, or the resin film/the non-thermoplastic polyimide film or the polymer film, and the adhesive layer. However, the present invention is not limited to this method, and combination with another technical process can be made. The term "resin film" means a layer or film comprising the material containing the thermoplastic polyimide resin according to any one of the first to third embodiments as described above, or a layer comprising the resin film or the polyimide resin composition containing the thermoplastic polyimide resin as described above and the thermosetting component. The resin film may be either surface-treated or surface-untreated.

Next, description will be made of the method for manufacturing the printed circuit board using the laminate comprising the thermoplastic polyimide resin film or the resin film and the non-thermoplastic polyimide resin or the polymer film. In a first method for manufacturing the printed circuit board, electroless copper plating is performed on the surface of the thermoplastic polyimide resin film. The electroless plating can be performed by chemical plating using a palladium catalyst or direct plating using palladium, carbon or the like. Furthermore, a resist film is formed on the electroless-plated copper, and then partially removed by exposure and etching to expose a portion where a circuit is to be formed. Next, the circuit is formed by electrolytic copper pattern plating using the exposed portion of the electroless-plated copper as a feeding electrode. Then, the resist film is removed, and then the unnecessary portion of the electroless-plated copper is etched off to complete the circuit. This method is referred to as the "semi-additive method".

A second method for manufacturing the printed circuit board is performed as follows: First, an electroless-plated copper layer is formed on the surface of the thermoplastic polyimide resin film by the same method as described above. Next, electrolytic copper plating is performed, and then a resist film is formed on the surface of the electroplated copper layer. Then, the resist film is partially removed by exposure and development to resolve a portion where a circuit is not to be formed, and then the unnecessary portion of the metal layer is etched off to form the circuit. This method is referred to as the "subtractive method".

Next, description will be made of use of the laminate comprising the thermoplastic polyimide resin film or the resin film, the non-thermoplastic polyimide film or the polymer film, and the thermoplastic polyimide film or the resin film.

In a first method for manufacturing the printed circuit board, via holes are first formed in the laminate so as to pass through it. The via holes are formed by a drilling method using a carbon dioxide gas laser or UV-YAG laser, or a method such as punching or drilling. In order to form small via holes, a drilling method using a laser is preferably used. After the via holes are formed, a desmearing process is performed for removing smears mainly composed of the polyimide decomposition product and thermally carbonized products, which are produced in the via holes and around the via holes. The desmearing process can be performed by a known method, such as a wet process using a permanganate, or a dry process using plasma or the like. Any one of the laminates of the present invention has durability to the permanganate desmearing process which is widely used for manufacturing printed circuit boards, and is thus desirably used. Next, electroless copper plating is performed on the surface of the thermoplastic polyimide resin film and in the via holes. A circuit is formed by the above-described semi-additive method.

A second method for manufacturing the printed circuit board is performed as follows: First, via holes are formed in the laminate comprising the thermoplastic polyimide resin film or the resin film, the non-thermoplastic polyimide film or the polymer film, and the thermoplastic polyimide resin film or the resin film so as to pass through the laminate. Next, the desmearing process is performed as described above, and then electroless-plated copper layers are formed on the surface of the thermoplastic polyimide resin and in the via holes. Next, panel plating is performed by electrolytic copper plating to electrically connect both surfaces of the laminate through the via holes. Then, a circuit is formed by the same subtractive method as described above.

Next, description will show the method for manufacturing the printed circuit board using the laminate comprising the thermoplastic polyimide resin film or the resin film, the non-thermoplastic polyimide film or the polymer film, and the copper foil.

In a first method for manufacturing the printed circuit board, via holes are formed to pass through the thermoplastic polyimide resin film and the non-thermoplastic polyimide film and extend to the metal copper foil and/or pass through the metal copper foil. The via holes are formed by a method using a carbon dioxide gas laser or UV-YAG laser or a method such as punching or drilling. After the via holes are formed, the surface of the thermoplastic polyimide resin and the insides of the via holes are desmeared, and then a circuit is formed by the same semi-additive method as described above.

In a second method for manufacturing the printed circuit board, via holes are formed to pass through the thermoplastic polyimide resin film or the resin film and the non-thermoplastic polyimide film or the polymer film and extend to the metal copper foil or pass through the metal copper foil. Next, desmearing and electroless copper plating are performed by the same method as described above, and then electrolytic copper plating is performed on the electroless-plated copper layer to electrically connect both surfaces of the laminate through the via holes. Then, a circuit is formed by the same subtractive method as described above.

Next, description will be made of the method for manufacturing the wiring board using the laminate comprising the thermoplastic polyimide resin film or the resin film, the non-thermoplastic polyimide film or the polymer film, and the adhesive layer.

In a first method for manufacturing the printed circuit board, the laminate and the wiring board are laminated by a method under heating and/or pressure so that the adhesive layer faces the circuit surface of the wiring board on which a circuit has been formed. Next, via holes are formed to pass through the surface-treated thermoplastic polyimide resin film and the non-thermoplastic polyimide film and extend to the circuit of the wiring board. The via holes are formed by a drilling method using a carbon dioxide gas layer, a UV-YAG layer, a drilling machine, a dry plasma apparatus, a UV laser, an excimer laser, or the like. After the via holes are formed, the desmearing process is preformed for removing the smears mainly composed of the melted and decomposition products of polyimide and the thermally carbonized products, which are produced at least in the via holes. Then, electroless copper plating is performed after the via holes are formed, and a circuit is formed by the semi-additive method.

A second method for manufacturing the printed circuit board is performed as follows: First, the laminate and the wiring board are laminated by a method under heating and/or pressure so that the adhesive layer faces the circuit surface of the wiring board on which a circuit has been formed. Next, via holes are formed to pass through the thermoplastic polyimide resin film or the resin film and the non-thermoplastic polyimide film or the polymer film and extend to the circuit of the wiring board. After the via holes are formed, the desmearing process and electroless copper plating are performed by the same method as described above, and then, a circuit is formed by the subtractive method.

In these methods, the metal layer can be formed by sputtering instead of electroless plating. In manufacturing the multilayer printed wiring board, the resin film of the present invention may be laminated on the a flexible printed wiring board comprising a resin film such as a polyimide film or the like used as a base, on a surface of which a circuit has been formed, or a rigid board comprising a glass epoxy substrate, a bismaleimide-triazine substrate, or the like, using a thermoplastic or thermosetting adhesive so that the surface having the specified surface shape faces outward. Then, a circuit may be formed on the resin film by the same method as any one of the above-described methods for manufacturing the printed circuit board.

Any of the laminates of the present invention has durability to the desmearing process using a general permanganate in the process for manufacturing the printed circuit board, and thus can be desirably used. Also, electroless plating can be performed by chemical plating using the catalytic function of a noble metal such as palladium or the like, and copper, nickel, gold, or the like can be used as the deposited metal. Alternatively, direct plating using palladium, carbon, an organic manganese conductive film, or a conductive polymer can be performed, and a liquid resist, a dry film resist, or the like can be used as the resist. In particular, the dry film resist can be preferably used because of its excellent handleability. When a circuit is formed by the semi-additive process, etching for removing the feeding layer is appropriately selected according to the type of the electroless plating performed in the process. For example, in electroless copper plating, a sulfuric acid/hydrogen peroxide or ammonium persulfate/sulfuric acid etchant is preferably used. In electroless nickel or gold plating or the like, an etchant which can selectively etch such a metal is preferably used. Furthermore, the via holes are preferably formed with a UV-YAG laser or excimer laser for forming small via holes, particularly via holes of 50 µm or less in diameter, preferably via holes of 30 µm or less in diameter.

In the present invention, chemical etching can be performed by any one of many known methods, for example, electroless copper plating, solder electroplating, tin electroplating, electroless nickel plating, electroless gold plating, electroless silver plating, electroless tin plating, or the like. However, in industrial viewpoint and the viewpoint of electrical properties such as migration resistance, and the like, electroless copper plating and electroless nickel plating are preferred, and electroless copper plating is particularly preferred.

When the laminate of the present invention comprises the polymer film and the layer provided on one surface thereof, the layer comprising the polyimide resin composition containing the thermoplastic polyimide resin and the thermosetting component, or comprises the polymer film and the layers provided on both surfaces thereof, each of the layers comprising the polyimide resin composition, the laminate and an inner wiring board must be strongly bonded together with an adhesive. As the adhesive, an ordinary adhesive can be used, and the same adhesive as those described above can be preferably used.

As the adhesive used for laminating the laminate of the present invention and the inner wiring board, a polyimide resin, an epoxy resin, or a cyanate ester resin, or a blend thereof can be preferably used from the viewpoint of adhesiveness, processability, heat resistance, flexibility, dimensional stability, low dielectric properties, cost, etc. Although the thickness of the adhesive layer is not particularly limited, the thickness is preferably sufficient to bury the circuit of the inner wiring board therein. Also, the form of the adhesive is not particularly limited, but a sheet is preferred in view of handleability.

In the laminate of the present invention comprising the polymer film and the layers provided on both surfaces thereof according to the present invention, the layers each comprising the polyimide resin composition, the polyimide resin composition layer and the adhesive must be strongly bonded together, and thus a care must be taken to select the adhesive. In the laminate, either of the polyimide resin composition layers may be bonded to the adhesive, and the thickness of the polyimide resin composition layer bonded to the adhesive is not particularly limited. In addition, surface treatment can be performed for strongly bonding the layer and the adhesive together. On the other hand, in the method for manufacturing the printed circuit board of the present invention, the surface of the metal foil can be transferred to the layer surface by laminating the laminate of the present invention and the metal foil under heating and/or pressure, and thus the circuit formed on the layer can be strongly bonded to the layer. Therefore, in the laminate, the polyimide resin composition layer laminated in contact with the metal layer is preferably in the semi-cured state, particularly, without irregularity.

The laminate produced as described above in the present invention enables the formation of a microcircuit having high insulation resistance and high adhesive strength, and thus can be used as a material for printed wiring boards having microwiring and a material for build-up wiring boards.

In the method for manufacturing the printed circuit board of the present invention, the chemical plating must be preformed to a thickness sufficient to form a plated film serving as the feeding electrode in the via holes and/or through holes formed by laser drilling or the like. Therefore, the thickness is preferably 100 nm to 1,000 nm and more preferably 200 nm to 800 nm. With a thickness of less than 100 nm, the thickness of the electroplated film serving as the feeding electrode varies, while with a thickness of over 1,000 nm, extra etching must be performed in the etching step in the method for manufacturing the printed circuit board of the present invention, thereby decreasing the circuit thickness or the circuit width to be smaller than a circuit design value. Furthermore, undercutting occurs to cause the problem of impairing the circuit shape.

In the method for manufacturing the printed circuit board of the present invention, known materials widely commercially available as photosensitive plating resist can be used. In the manufacturing method, a photosensitive plating resist having a pitch resolution of 50 μm or less is preferably used for decreasing the pitch. Of course, the printed wiring board obtained by the manufacturing method of the present invention may include a circuit with a wiring pitch of 50 μm or less and a circuit with a pitch larger than this.

In the method for manufacturing the printed circuit board of the present invention, the chemically plated layer can be removed with a known quick etchant. Preferred examples of such etchant include a sulfuric acid-hydrogen peroxide etchant, an ammonium persulfate etchant, a sodium persulfate etchant, a diluted ferric chloride etchant, and a diluted cupric chloride etchant.

The resin film used in the present invention may further contain a component other than the above-described components as long as the characteristics are not degraded. Similarly, the resin film of the present invention may be subjected a step other than the above-described steps.

As a result of research, the inventors found that the polyimide resin composition layer according to the present invention can be strongly bonded to the chemically plated film even when the surface roughness is 3 μm or less. Namely, high adhesiveness and formation of a microcircuit can be simultaneously satisfied. Furthermore, when the surface roughness is low, the feeding electrode can be removed by etching within a short time in the semi-additive method, as compared with the case of high surface roughness. Therefore, the resin composition layer is suitable for forming a microcircuit. In other words, etching can be completed within a short time to decrease the amount of etching of the circuit pattern formed by electroplating, thereby permitting the formation of a circuit according the design width and thickness as desirable. Therefore, the composition layer is particularly preferred for forming a microcircuit.

Furthermore, by using the laminate of the present invention, ordinary processes such as the desmearing process and electroless plating process can be applied, and thus a high-density circuit with a L/S of 20 μm/20 μm or less, particularly 10 μm/10 μm or less, can be formed. Therefore, the printed circuit board having excellent adhesiveness and high adhesive reliability in a severe environment of high temperature and high humidity, and the like can be obtained. Furthermore, the laminate of the present invention permits the manufacture of a flexible printed circuit board with excellent adhesiveness and environmental stability, a multilayer flexible printed wiring board comprising a laminate of flexible printed wiring boards, a rigid-flex wiring board comprising a laminate of a flexible printed wiring board and a rigid printed wiring board, a build-up wiring board, a TAB tape, a COF substrate comprising a semiconductor element mounted on directly on a printed circuit board, a MCM substrate, and the like.

In the method for manufacturing the printed circuit board of the present invention, a microcircuit pattern can be satisfactorily formed on the surface micro-irregularity of the polyimide resin composition layer of the present invention even under lamination conditions such as a relatively low pressure, and high adhesive strength can be achieved. Also, the feeding electrode on the surface micro-irregularity can be sufficiently etched off without residue, and the polyimide resin composition of the present invention has high insulating resistance. For these two reasons, high insulation property required for a microcircuit space, which will contain the further narrowed pitch in future, can be realized. Furthermore, the laminates of the present invention can be preferably used for the printed circuit board and the method for manufacturing the printed circuit board according to the present invention.

Although the advantages of the present invention will be described in further detail below with reference to examples, the present invention is not limited to these examples, and various modifications, changes, and alternations can be made by a person skilled in the art within the scope of the present invention. In the examples below, formation of various non-thermoplastic polyimide films, formation of thermoplastic polyimide resins, formation of laminates, synthesis and formation of adhesive layers, lamination, electroless plating, and various measurements and evaluations were carried out as described below.

<Preparation A of Non-Thermoplastic Polyimide Film>

A conversion agent comprising 17 g of acetic anhydride and 2 g of isoquinoline was mixed with 90 g of a DMF (N,N-dimethylformamide) solution of 17% by weight polyamic acid synthesized from pyromellitic dianhydride, 4,4'-diaminodiphenyl ether, and p-phenylenediamine at a molar ratio of 4/3/1, followed by stirring. After defoaming by centrifugation, the resultant mixture was applied by casting to a thickness of 700 μm on an aluminum foil. The process from stirring to defoaming was performed under cooling at 0° C. The resulting laminate of the aluminum foil and the polyamic acid solution layer was heated at 110° C. for 4 minutes to form a self-supporting gel film. The gel film had a volatile residue content of 30% by weight and a rate of imidization of 90%. Then, the gel film was peeled from the aluminum foil and fixed to a frame. The gel film was heated at 300° C., 400° C., and 500° C. for 1 minute each to produce a polyimide film A having a thickness of 25 μm.

<Preparation B of Non-Thermoplastic Polyimide Film>

A polyimide film B was formed by the same method as Formation A except that polyamic acid was synthesized from pyromellitic dianhydride and 4,4'-diaminodiphenyl ether at a molar ratio of 1/1.

<Preparation C of Non-Thermoplastic Polyimide Film>

A polyimide film C was formed by the same method as Formation A except that a DMAc (N,N-dimethylacetamide) solution of 17% by weight polyamic acid was used, the polyamic acid being synthesized from 3,3',4,4'-biphenyltetracarboxylic dianhydride, p-phenylenebis(trimellitic acid monoester anhydride), p-phenylenediamine, and 4,4'-diaminodiphenyl ether at a molar ratio of 4/5/7/2.

<Preparation X of Thermoplastic Polyimide Precursor>

In DMF, 1,2-bis[2-(4-aminophenoxy)ethoxy]ethane (referred to as "DA3EG" hereinafter) and 2,2'-bis[4-(4-aminophenoxy)phenyl]propane (referred to as "BAPP" hereinafter) at a molar ratio of 3:7 were dissolved, and 3,3',4,4'-ethylene glycol dibenzoate tetracarboxylic dianhydride (referred to as "TMEG" hereinafter) and 3,3',4,4'-benzophenone tetracarboxylic dianhydride (referred to as "BTDA" hereinafter) at a molar ratio of 5:1 were added to the resultant solution under stirring. The resultant mixture was stirred for about 1 hour to obtain a polyamic acid DMF solution having a solid content of 20% by weight. Then, a single sheet of the resulting thermoplastic polyimide resin was formed, and the glass transition temperature of the sheet was measured. As a result, the glass transition temperature was 152° C.

<Preparation Y of Thermoplastic Polyimide Precursor>

BAPP was uniformly dissolved in DMF, and 3,3',4,4'-biphenyltetracarboxylic dianhydride and ethylenebis(trimellitic acid monoester anhydride) at a molar ratio 4:1 were added to the resultant solution under stirring so that the acid dianhydride and the diamine became equimolar. Then, the resultant mixture was stirred for about 1 hour to obtain a polyamic acid DMF solution having a solid content of 20% by weight. Then, a single sheet of the resulting thermoplastic polyimide resin was formed, and the glass transition temperature of the sheet was measured. As a result, the glass transition temperature was 225° C.

<Preparation Z of Thermoplastic Polyimide Precursor>

In DMF, 1,3-bis(3-aminophenoxy)benzene and 3,3'-dihydroxybenzidine at a molar ratio of 4:1 were dissolved, and 4,4'-(4,4'-isopropylidenediphenoxy) bis(phthalic anhydride) was added to the resultant solution under stirring so that the acid dianhydride and the diamine became equimolar. Then, the resultant mixture was stirred for about 1 hour to obtain a polyamic acid DMF solution having a solid content of 20% by weight. Then, a single sheet of the resulting thermoplastic polyimide resin was formed, and the glass transition temperature of the sheet was measured. As a result, the glass transition temperature was 160° C.

<Formation of Laminate>

Each of the above-described non-thermoplastic polyimide films A to C formed in Preparations A to C, respectively, was used as a core film, and each of the DMF solutions of polyamic acid, which was a precursor of thermoplastic polyimide, prepared in Preparations X, Y, and Z was applied to both or one of the surfaces of the core film by a gravure coater.

After application, heat treatment was performed to remove the solvent or imidize the polyamic acid at a final heating temperature of 390° C. to form a laminated polyimide film comprising a non-thermoplastic polyimide layer and a thermoplastic polyimide layer. The amount of coating was changed to form films comprising thermoplastic polyimide layers with different thicknesses. For example, when the non-thermoplastic polyimide film A was used, the resulting film comprising the thermoplastic polyimide layer formed on one surface by using the precursor prepared by Preparation X is denoted by X/A, the resulting film comprising the thermoplastic polyimide layers formed on both surfaces by using the precursor prepared by Preparation X is denoted by X/A/X, and the resulting film comprising the thermoplastic polyimide layer formed on one surface by using the precursor prepared by Preparation X, and a copper foil formed on the other surface is denoted by X/A/Cu.

<Synthesis and Formation of Adhesive Layer>

In a nitrogen atmosphere, one equivalent of bis{4-(3-aminophenoxy)phenyl}sulfone (referred to as "BAPS-M" hereinafter) was dissolved in N,N-dimethylformamide (referred to as "DMF" hereinafter). The resultant solution was stirred under cooling, and one equivalent of 4,4'-(4,4'-isopropylidenediphenoxy) bis(phthalic anhydride) (referred to as "BPADA" hereinafter) was added to the solution to obtain a polyamic acid polymer solution having a solid content of 30% by weight. The polyamic acid solution was heated at 200° C. for 180 minutes under a reduced pressure of 665 Pa to obtain a solid thermoplastic polyimide resin. The resultant polyimide resin, a novolac epoxy resin (Epicoat 1032H60: manufactured by Yuka-Shell Company), and 4,4'-diaminodiphenylsulfone (referred to as "4,4'-DDS" hereinafter) were mixed at a weight ratio of 70/30/9. Then, the resultant mixture was dissolved in dioxolan so that the solid content was 20% by weight, to obtain an adhesive solution. The resulting adhesive solution was applied to the polyimide film surface of the laminate formed as described above so that the dry thickness was 12.5 μm, and then dried at 170° C. for 2 minutes to obtain a laminate.

<Lamination Process>

An inner circuit board was formed using a glass epoxy copper-clad laminate comprising a copper foil of 12 μm in thickness. Then, the laminate formed as described above was laminated on the inner circuit board and cured by vacuum pressing under conditions including a temperature of 200° C., a heat plate pressure of 3 MPa, a pressing time of 2 hours, and a vacuum condition of 1 kpa.

<Electroless Copper Plaiting>

An electroless plating process manufactured by Atotech K. K. shown in the table below was used.

(Electroless Plating Conditions)

TABLE 1

| Process | Composition of Reactive Solution | | Condition |
|---|---|---|---|
| Cleaner | Cleaner Securigant 902 (Ⓧ) | 40 ml/l | 60° C. |
| Conditioner | Cleaner Additive 902 (Ⓧ) | 3 ml/l | 5 min. |
| | Sodium Hydroxide | 20 g/l | dipping |
| (Washing) | | | |
| Predip | Predip Neogant B (Ⓧ) | 20 ml/l | room |
| | Sulfuric acid | 1 ml/l | temp. |
| | | | 1 min. |
| | | | dipping |
| Adding catalyst | Activater Neogant 834 conc (Ⓧ) | 40 ml/l | 40° C. |
| | Sodium Hydroxide | 4 g/l | 5 min. |
| | Boric Acid | 5 g/l | dipping |
| (Washing) | | | |
| Reduction | Reducer Neogant (Ⓧ) | 1 g/l | room |
| | Sodium Hydroxide | 5 g/l | |
| (Washing) | | | |
| Elecroless copper plating | Basic Solutin Printgant MSK-DK (Ⓧ) | 80 ml/l | 35° C. 15 min. |
| | Copper Solution Printgant MSK (Ⓧ) | 40 ml/l | dipping |
| | Stabilizer Printdgant MSK-DK (Ⓧ) | 3 ml/l | |
| | Reducer Copper (Ⓧ) | 14 ml/l | |
| (Washing) | | | |

(Ⓧ) (manufactured by Atotech K. K.)

<Copper Electroplating Method>

Copper electroplating was performed by pre-washing in 10% sulfuric acid for 30 seconds and then plating at room temperature for 40 minutes. The current density was 2 A/dm$^2$.

<Formation of Resist Layer>

A liquid photosensitive plating resist (manufactured by Japan Synthetic Rubber Co., Ltd., THB320P) was coated and then exposed to light with a high-voltage mercury-vapor lamp through a mask to form a resist pattern having desired L/S.

<Measurement of Adhesive Strength>

Adhesive strength was measured with a pattern width of 3 mm, a peeling angle of 90°, and a peeling rate of 50 mm/min according to IPC-TM-650-method.2.4.9.

<Pressure Cooker Test>

The test was performed at 121° C. and 100% RH for 96 hours.

<Measurement of Surface Roughness>

The ten-point medium height on a thermoplastic polyimide resin surface was measured with an optical interference-type surface roughness meter, New View 5030 System, manufactured by ZYGO Corporation.

<Measurement of Surface Shape>

The arithmetic mean roughness on a resin surface was measured with an optical interference-type surface roughness meter, New View 5030 System, manufactured by ZYGO Corporation under the following conditions:

(Measurement Conditions)
  Objective lens: ×50 Miura Image Zoom: 2
  FDA Res: Normal
(Analytical Conditions)
  Remove: Cylinder
  Filter: High Pass
  Filter Low Waven: 0.002 mm and 0.1 mm <Confirmation of Metal Etching Residue in Micro-Wiring>

The spaces of wiring were observed with SEMEDX Type-N (manufactured by Hitachi, Ltd.) to confirm the presence of a peak of a metal element.

<Measurement of Adhesive Strength>

Adhesive strength was measured with a pattern width of 3 mm, a peeling angle of 90°, and a peeling rate of 50 mm/min according to IPC-TM-650-method.2.4.9.

<Measurement of Coefficient of Linear Expansion>

The coefficient of linear expansion of a thermoplastic polyimide/non-thermoplastic polyimide laminate was measured with TMA120C manufactured by Seiko Instruments Inc. under the conditions including a heating rate of 20° C./min, a nitrogen flow rate of 50 ml/min, a sample shape of 3 mm in width and 10 mm in length, and a load of 3 g. The measurement was conducted two times from room temperature to 300° C., and the average from 100° C. to 200° C. in the second measurement was determined as the coefficient of linear expansion of the laminate.

<Glass Transition Temperature>

The storage modulus ($\epsilon'$) of a cured resin sheet was measured with DMS-200 (manufactured by Seiko Instruments Inc.) with a measurement length (measurement jig distance) of 20 mm under the conditions below. The inflection point of the storage modulus ($\epsilon'$) curve was determined as the glass transition temperature (° C.) of the resin.
  Measurement atmosphere: dry air atmosphere
  Measurement temperature: 20 to 400° C.
  Measurement sample: cured resin sheet of 9 mm in width and 40 mm in length

EXAMPLES 1 TO 9

Each of the polyamic acid solutions prepared in Preparations X, Y, and Z was applied to one of the surfaces of each of the non-thermoplastic polyimide films A, B, and C of 25 μm in thickness formed in Preparations A, B, and C to form a laminate. The thickness of the thermoplastic polyimide layer was 3 μm, and a copper foil was placed on the thermoplastic polyimide layer and then laminated with a heat roll at a temperature of 340° C., a linear pressure of 20 kgf/cm, and a linear velocity 1.5 m/min. As the copper foil, a rolled copper foil, BHY-22B-T, of 18 μm in thickness (Rz=1.5 μm) manufactured by Japan Energy Co., Ltd. was used. Then, the laminated copper foil was completely removed using a hydrochloric acid/ferric chloride etchant to obtain a laminate comprising a surface-treated thermoplastic polyimide resin film according to the present invention. The surface roughness of the surface-treated film was measured.

Then, electroless copper plating and electrolytic copper plating were performed to form a copper layer having a thickness of 18 μm, and adhesive strength was measured at room temperature and after the pressure cooker test. The results are shown in Table 2.

COMPARATIVE EXAMPLES 1 TO 3

A laminate was formed by the same method as in Examples 1 to 9 except that surface treatment comprising laminating the copper foil and then removing was not conducted, and the same test as in Example 1 was conducted. The results are shown in Table 2.

TABLE 2

| Example | Material Composition | Surface-treatment | Surface Roughness Rz (μm) | Ra1 (μm) | Ra2 (μm) | Ra1/Ra2 | Adhesive strength (N/cm) | Adhesive Strength after PCT test (N/cm) |
|---|---|---|---|---|---|---|---|---|
| 1 | X/A | Rolled Copper Fiol | 1.1 | 0.19 | 0.23 | 0.83 | 9 | 7 |
| 2 | X/B | Rolled Copper Fiol | 1.1 | 0.18 | 0.22 | 0.82 | 9 | 7 |
| 3 | X/C | Rolled Copper Fiol | 1.3 | 0.21 | 0.27 | 0.78 | 9 | 6 |
| 4 | Y/A | Rolled Copper Fiol | 1.2 | 0.17 | 0.25 | 0.68 | 8 | 6 |
| 5 | Y/B | Rolled Copper Fiol | 1.1 | 0.15 | 0.25 | 0.60 | 10 | 6 |
| 6 | Y/C | Rolled Copper Fiol | 1.3 | 0.18 | 0.28 | 0.64 | 8 | 7 |
| 7 | Z/A | Rolled Copper Fiol | 1.2 | 0.19 | 0.21 | 0.90 | 9 | 7 |
| 8 | Z/B | Rolled Copper Fiol | 1.1 | 0.18 | 0.21 | 0.86 | 10 | 6 |
| 9 | Z/C | Rolled Copper Fiol | 1.1 | 0.18 | 0.20 | 0.90 | 9 | 7 |

TABLE 2-continued

| Example | Material Composition | Surface-treatment | Surface Roughness Rz (μm) | Ra1 (μm) | Ra2 (μm) | Ra1/Ra2 | Adhesive strength (N/cm) | Adhesive Strength after PCT test (N/cm) |
|---|---|---|---|---|---|---|---|---|
| Comparative Example 1 | X/A | none | 0.1 | 0.02 | 0.03 | 0.67 | <1 | <1 |
| Comparative Example 2 | Y/A | none | 0.1 | 0.02 | 0.03 | 0.67 | <1 | <1 |
| Comparative Example 3 | Z/A | none | 0.1 | 0.02 | 0.02 | 1 | <1 | <1 |

The results indicate that in the laminate of the present invention, an electroless-plated layer with a high adhesiveness of 5 N/cm or more can be formed on a moderately roughened surface with low roughness.

EXAMPLES 10 TO 26

Experiment was carried out to confirm the effects of various surface treatments. The polyamic acid solution prepared in Preparation Y was applied to one of the surfaces of the non-thermoplastic polyimide film of 25 μm in thickness formed in Preparation B to form a laminate. The thickness of the thermoplastic polyimide layer was each of 1, 3, and 5 μm.

(1) Surface treatment with an electrolytic copper foil was performed by laminating an electrolytic copper foil, 3EC-VLP oil (thickness 18 μm, Rz=4.6 μm) manufactured by Mitsui Kinzoku K. K. by the same method as in Examples 1 to 9.

(2) Surface treatment with a permanganate was performed by the permanganate desmearing system (manufactured by Atotech K. K.) shown in the table below.

<Conditions of Permanganate Desmearing>

TABLE 3

| process | Composition of Reactive Solution | | condition | |
|---|---|---|---|---|
| Swelling | Swelling Securigant P (✕) | 500 ml/L | 60° C. | |
| | NaOH | 3 g/l | 5 min. dipping | |
| (Washing) | | | | |
| Micro-etching | Concentrate Compact CP (✕) | 550 ml/L | 80° C. | |
| | NaOH | 40 g/l | 5 min. dipping | |
| (Washing) | | | | |
| Reduction | Reduction Solution Securigant P500 (✕) | 70 ml/L | 40° C. | |
| | Sulfuric Acid | 50 ml/l | 5 min. dipping | |
| (Washing) | | | | |

(✕) (manufactured by Atotech K. K.)

(3) Surface treatment with an organic alkali compound was performed by dipping the laminate in a mixed solution of potassium hydroxide, ethanolamine, and water at a weight ratio of 2/5/1 at 30° C. for 5 minutes, and then sufficiently washing the laminate with water.

(4) Surface treatment with an organic solvent is performed by dipping the laminate in DMF used as a solvent at 40° C. for 5 minutes and then sufficiently washing the laminate with water.

These surface-treated laminates were evaluated by the same method as in Examples 1 to 9. When two types of surface treatments were combined, the surface treatments were sequentially performed in the order shown in Table 4 (in which "rolled copper foil+permanganate" means that surface treatment with a rolled copper foil was performed first, and treatment with a permanganate was performed next). The results are shown in Table 4.

COMPARATIVE EXAMPLE 4

The same evaluation as described above was performed except that the laminate used Examples 10 to 26 was not subjected to surface treatment. The results are shown in Table 4.

COMPARATIVE EXAMPLE 5

For comparison, the same evaluation as described above was performed using an epoxy resin. First, 80 parts of EP-1001 manufactured by Yuka-Shell Epoxy Co., Ltd., 10 parts of EP-828 manufactured by Yuka-Shell Epoxy Co., Ltd., 10 parts of EP-154 manufactured by Yuka-Shell Epoxy Co., Ltd., 0.4 part of imidazole curing accelerator 2E4MZ manufactured by Shikoku Kasei Co., Ltd., and 3.5 parts of dicyandiamide were uniformly mixed and/or dispersed. Then, the resultant mixture was dissolved in methyl ethyl ketone, and the resulting solution was applied to a uniform thickness on a glass epoxy substrate, and then dried and cured at 120° C. for 15 minutes and at 150° C. for 30 minutes to obtain an epoxy resin film. Then, the same desmearing process as in Examples 1 to 9 was performed, and surface roughness was evaluated. Next, electroless plating and electroplating were performed by the same operation as in Examples 1 to 9, and adhesive strength was evaluated.

TABLE 4

| Example | Material Composition B = 25 μm | Thickness of Thermoplastic Polyimide layer (μm) | Surface-treatment | Surface Roughness Rz (μm) | Ra1 (μm) | Ra2 (μm) | Ra1/Ra2 | Adhesive strength (N/cm) | Adhesive Strength after PCT test (N/cm) |
|---|---|---|---|---|---|---|---|---|---|
| 10 | Y/B | 1 | Rolled Copper Fiol | 0.7 | 0.12 | 0.19 | 0.63 | 5 | 4 |
| 11 | Y/B | 5 | Rolled Copper Fiol | 1.2 | 0.17 | 0.25 | 0.68 | 9 | 6 |
| 12 | Y/B | 1 | Electrolytic Copper Foil | 0.7 | 0.13 | 0.23 | 0.57 | 5 | 3 |

TABLE 4-continued

| Example | Material Composition B = 25 μm | Thickness of Thermoplastic Polyimide layer (μm) | Surface-treatment | Surface Roughness Rz (μm) | Ra1 (μm) | Ra2 (μm) | Ra1/Ra2 | Adhesive strength (N/cm) | Adhesive Strength after PCT test (N/cm) |
|---|---|---|---|---|---|---|---|---|---|
| 13 | Y/B | 3 | Electrolytic Copper Foil | 3.5 | 0.21 | 0.51 | 0.41 | 11 | 6 |
| 14 | Y/B | 5 | Electrolytic Copper Foil | 3.7 | 0.22 | 0.55 | 0.40 | 11 | 6 |
| 15 | Y/B | 1 | Permanganate | 0.2 | 0.06 | 0.07 | 0.86 | 6 | 4 |
| 16 | Y/B | 3 | Permanganate | 0.2 | 0.06 | 0.07 | 0.86 | 5 | 4 |
| 17 | Y/B | 5 | Permanganate | 0.2 | 0.06 | 0.08 | 0.75 | 6 | 4 |
| 18 | Y/B | 1 | Ethanolamine | 0.1 | 0.05 | 0.05 | 1.00 | 5 | 4 |
| 19 | Y/B | 3 | Ethanolamine | 0.1 | 0.05 | 0.06 | 0.83 | 5 | 4 |
| 20 | Y/B | 5 | Ethanolamine | 0.2 | 0.06 | 0.06 | 1.00 | 6 | 5 |
| 21 | Y/B | 1 | DMF | 0.3 | 0.07 | 0.09 | 0.78 | 5 | 4 |
| 22 | Y/B | 3 | DMF | 0.3 | 0.06 | 0.09 | 0.67 | 6 | 4 |
| 23 | Y/B | 5 | DMF | 0.3 | 0.06 | 0.08 | 0.75 | 5 | 4 |
| 24 | Y/B | 1 | Rolled Copper Fiol + Permanganate | 0.8 | 0.14 | 0.22 | 0.64 | 6 | 4 |
| 25 | Y/B | 3 | Rolled Copper Fiol + Permanganate | 1.5 | 0.18 | 0.29 | 0.62 | 8 | 5 |
| 26 | Y/B | 5 | Rolled Copper Fiol + Permanganate | 1.6 | 0.19 | 0.29 | 0.66 | 8 | 5 |
| Comparative Example 4 | Y/B | | none | 0.1 | 0.02 | 0.03 | 0.67 | <1 | <1 |
| Comparative Example 5 | Epoxy Resin | — | Permanganate | 0.8 | 0.06 | 0.16 | 0.38 | 3 | <1 |

Table 4 indicates that the thickness of a proper thermoplastic polyimide resin film depends upon the treatment type, and, in order to exhibit high adhesiveness, the thickness of the thermoplastic polyimide resin film is preferably larger than the surface roughness Rz of the roughened surface of the thermoplastic polyimide resin subjected to surface treatment, and more preferably at least 2 times the surface roughness Rz. It is also found that the thermoplastic polyimide resin of the present invention has higher adhesiveness than that of an epoxy resin with the same degree of surface roughness.

EXAMPLES 27 TO 38

The polyamic acid solution prepared in Preparation Y was applied to both surfaces of each of the non-thermoplastic polyimide films of 7.5 μm, 12.5 μm, 25 μm, and 50 μm, respectively, in thickness formed in Preparation C of polyimide film to form laminates comprising thermoplastic polyimide layers having different thicknesses. Each of the thermoplastic polyimide layers was surface-treated using the same copper foil as in Examples 1 to 9, and the coefficient of thermal expansion was measured. Then, electroless plating and electrolytic plating were performed by the same method as in Examples 1 to 9 to form a copper layer having a thickness of 18 μm, and adhesive strength was measured at room temperature and after the pressure cooker test. The results are shown in Table 5. In experiment, the coefficient of thermal expansion of the non-thermoplastic film C was 12 ppm/° C. The coefficient of thermal expansion was measured after formation of the thermoplastic layer, and evaluated on the basis of the following criteria: A thermal expansion coefficient of 20 ppm/° C. or less was evaluated as A, a thermal expansion coefficient of 25 ppm/° C. or less was evaluated as B, a thermal expansion coefficient of 30 ppm/° C. or less was evaluated as C, and a thermal expansion coefficient of 30 ppm/° C. or more was evaluated as D.

TABLE 5

| Example | Thickness Of Non-thermoplastic polyimide Film C (μm) | Thickness of Thermoplastic Polyimide layer Y (μm) | Surface Roughness Rz (μm) | Ra1 (μm) | Ra2 (μm) | Ra1/Ra2 | Adhesive strength (N/cm) | Adhesive Strength after PCT test (N/cm) | Coefficient Of Linear Expansion |
|---|---|---|---|---|---|---|---|---|---|
| 27 | 7.5 | 1 | 0.7 | 0.12 | 0.18 | 0.67 | 5 | 4 | A |
| 28 | 7.5 | 3 | 1.1 | 0.15 | 0.24 | 0.63 | 8 | 6 | C |
| 29 | 7.5 | 5 | 1.2 | 0.17 | 0.25 | 0.68 | 9 | 6 | D |
| 30 | 12.5 | 1 | 0.6 | 0.12 | 0.17 | 0.71 | 6 | 4 | A |
| 31 | 12.5 | 3 | 1.2 | 0.17 | 0.26 | 0.65 | 8 | 5 | B |
| 32 | 12.5 | 5 | 1.2 | 0.17 | 0.27 | 0.63 | 8 | 6 | C |
| 33 | 25 | 1 | 0.6 | 0.12 | 0.18 | 0.67 | 6 | 4 | A |
| 34 | 25 | 3 | 1.1 | 0.15 | 0.25 | 0.60 | 8 | 5 | A |
| 35 | 25 | 5 | 1.3 | 0.17 | 0.26 | 0.65 | 9 | 6 | B |
| 36 | 50 | 1 | 0.6 | 0.12 | 0.17 | 0.71 | 6 | 4 | A |
| 37 | 50 | 3 | 1.2 | 0.16 | 0.24 | 0.67 | 9 | 5 | A |
| 38 | 50 | 5 | 1.2 | 0.17 | 0.25 | 0.68 | 9 | 6 | A |

The results indicate that in order to exhibit excellent characteristics of the non-thermoplastic polyimide film, particularly low thermal expansion thereof, the total thickness of the thermoplastic polyimide resin films formed on both surfaces is preferably smaller than that of the non-thermoplastic polyimide film, more preferably ½ or less and most preferably ⅕ or less of the thickness of the non-thermoplastic polyimide film. It is important to determine the thickness in consideration of both these results and the thickness of a proper thermoplastic polyimide resin film determined according to the surface treatment type in Examples 1 to 9.

EXAMPLE 39

A rolled copper foil was laminated on each of both surfaces of a laminate with a structure Y/B/Y (Y was 3 µm in thickness, and B was 25 µm in thickness) by the same method as in Examples 1 to 9. Then, both copper foils were completely removed to obtain a laminate comprising the surface-treated thermoplastic polyimide resin film. Then, a circuit was formed on the laminate by the method below.

First, via holes of 30 µm in inner diameter were formed to pass through the laminate using a UV-YAG laser, and then desmeared with a permanganate under the same conditions as in Examples 1 to 9. At the same time, the thermoplastic polyimide resin was surface-treated. Next, electroless plating was performed to form a copper plated layer on the surface of the thermoplastic polyimide resin and in the via holes. Next, a liquid photosensitive plating resist (THB320P manufactured by Japan Synthetic Rubber Co., Ltd.) was coated and then exposed to light with a high-voltage mercury vapor lamp through a mask to form a resist pattern with a L/S of 15 µm/15 µm. Then, electrolytic copper plating was performed to form a copper circuit on a surface portion in which the electroless-plated copper film was exposed. The electrolytic copper plating was performed by pre-washing in 10% sulfuric acid for 30 seconds and then plating at room temperature for 40 minutes. The current density was 2 A/dm². The thickness of the electrolytic copper film was 10 µm. Next, the plating resist was removed with an alkaline remover, and the electroless copper plated layer was removed with a sulfuric acid/hydrogen peroxide etchant to obtain a printed circuit board.

The resultant printed circuit board had a designed L/S value. Also, the circuit pattern was strongly bonded with an adhesive strength of 8 N/cm.

EXAMPLE 40

A laminate having a structure X/A/Cu (X was 1 µm in thickness, A was 25 µm in thickness, and a copper foil was 15 µm in thickness) was prepared. In this state, the layer X, i.e., the thermoplastic polyimide resin film, had not been subjected to surface treatment. Then, a circuit was formed on the laminate by the method below.

Via holes were formed by applying a UV laser to the thermoplastic polyimide resin film side so as to pass through the thermoplastic polyimide resin film and the non-thermoplastic polyimide film and extend to the copper foil, and then desmeared with a permanganate under the same conditions as in Examples 1 to 9. At the same time, the thermoplastic polyimide resin was surface-treated. Next, electroless copper plating and electrolytic copper plating were performed. Next, a dry film resist (Asahikasei dry resist AQ) was coated on each copper layer, and exposure and development were performed. Then, an ordinary subtractive method was preformed to form a circuit with a L/S of 25 µm/25 µm on the surface of the thermoplastic polyimide resin and a circuit with a L/S of 100 µm/100 µm on the surface of the copper foil. As an etchant, an aqueous ferric chloride solution was used.

The resultant printed circuit board had a designed L/S value. Also, the circuit pattern was strongly bonded with an adhesive strength of 7 N/cm.

EXAMPLE 41

A rolled copper foil was laminated on either surface of a laminate having a structure X/B/X (X was 3 µm in thickness, and B was 25 µm in thickness) by the same method as in Examples 1 to 9. Then, the copper foils were completely removed to obtain the laminate comprising the surface-treated thermoplastic polyimide resin films on both surfaces. A circuit was formed on the laminate by the following method: First, via holes of 30 µm in inner diameter were formed using a UV-YAG laser so as to pass through the laminate. Next, electroless plating was performed to form copper plated films on the surface of the thermoplastic polyimide resin and in the via holes. Then, electrolytic copper plating is performed to form a copper plated layer having a thickness of 10 µm. The electrolytic copper plating was performed by pre-washing in 10% sulfuric acid for 30 seconds and then plating at room temperature for 40 minutes. The current density was 2 A/dm².

Next, a liquid photosensitive plating resist (THB320P manufactured by Japan Synthetic Rubber Co., Ltd.) was coated and then exposed to light with a high-voltage mercury vapor lamp through a mask to form a resist pattern with a L/S of 20 µm/20 µm. Then, an ordinary subtractive method (chemical: ferric chloride) was preformed using the resulting pattern to form a circuit.

The resultant printed circuit board had a designed L/S value. Also, the circuit pattern was strongly bonded with an adhesive strength of 8 N/cm.

EXAMPLE 42

The polyamic acid solution prepared by Preparation Y was applied to one of the surfaces of the non-thermoplastic polyimide film C of 12.5 µm in thickness prepared by Preparation C of polyimide film to form a laminate. The thickness of the thermoplastic polyimide film was 3 µm. Next, a rolled copper foil was laminated on one of the surfaces of the resultant laminate by the same method as in Examples 1 to 9. Then, an adhesive layer (12 µm) was applied to the non-thermoplastic polyimide film side to obtain a laminate comprising the copper foil layer, the thermoplastic polyimide resin film, the polyimide film, and the adhesive layer. The thus-obtained laminate was laminated on an inner circuit board prepared from a glass epoxy copper-clad laminate, and then cured. The lamination method was as described above.

Next, surface treatment was performed by dissolving off the copper foil with a ferric chloride etchant to form irregularity on the surface of the thermoplastic polyimide resin film. Then, via holes of 30 µm in inner diameter were formed using a UV-YAG laser so as to extend to the inner circuit, and then desmeared with a permanganate under the same conditions as in Examples 1 to 9. At the same time, the thermoplastic polyimide resin was surface-treated. Next, electroless plating was performed to form electroless copper plated films on the surface of the thermoplastic polyimide resin and in the via holes.

Next, a liquid photosensitive plating resist (THB320P manufactured by Japan Synthetic Rubber Co., Ltd.) was coated and then exposed to light with a high-voltage mercury vapor lamp through a mask to form a resist pattern with a L/S of 15 µm/15 µm. Then, electrolytic copper plating is performed to form a copper circuit on a surface portion where the electroless-plated copper film was exposed. The electrolytic copper plating was performed by pre-washing in 10% sulfuric acid for 30 seconds and then plating at room temperature for 40 minutes. The current density was 2 A/dm². The thickness of the electrolytic copper film was 10 µm. Next, the plating resist was removed with an alkaline remover, and the electroless-plated copper layer was removed with a sulfuric acid/hydrogen peroxide etchant to obtain a printed circuit board.

The resultant printed circuit board had a designed L/S value. Also, the circuit pattern was strongly bonded with an adhesive strength of 8 N/cm.

EXAMPLE 43

The polyamic acid solution prepared by Preparation Y was applied to one of the surfaces of the non-thermoplastic polyimide film C of 12.5 µm in thickness prepared by Preparation C of polyimide film to form a laminate. The thickness of the thermoplastic polyimide film was 1 µm. Next, an adhesive layer (12 µm) was applied to the non-thermoplastic polyimide film side to obtain a laminate comprising the thermoplastic polyimide resin film Y, the polyimide film C, and the adhesive layer. The thus-obtained laminate was laminated on an inner circuit board prepared from a glass epoxy copper-clad laminate, and then cured.

Next, via holes of 30 µm in inner diameter were formed using a UV-YAG laser so as to extend to the inner circuit, and then desmeared with a permanganate under the same conditions as in Examples 1 to 9. At the same time, the thermoplastic polyimide resin was surface-treated. Next, electroless plating was performed to form electroless copper plated films on the surface of the thermoplastic polyimide resin and in the via holes. Next, a liquid photosensitive plating resist (THB320P manufactured by Japan Synthetic Rubber Co., Ltd.) was coated and then exposed to light with a high-voltage mercury vapor lamp through a mask to form a resist pattern with a L/S of 10 µm/10 µm. Then, electrolytic copper plating is performed to form a copper circuit on a surface portion where the electroless-plated copper film was exposed. The electrolytic copper plating was performed by pre-washing in 10% sulfuric acid for 30 seconds and then plating at room temperature for 40 minutes. The current density was 2 A/dm². The thickness of the electrolytic copper film was 10 µm. Next, the plating resist was removed with an alkaline remover, and the electroless-plated copper layer was removed with a sulfuric acid/hydrogen peroxide etchant to obtain a printed circuit board. The resultant printed circuit board had a designed L/S value. Also, the circuit pattern was strongly bonded with an adhesive strength of 7 N/cm.

(Preparation T of Thermoplastic Polyimide Precursor)

In a 2000-mL glass flask, one equivalent of bis{4-(3-aminophenoxy)phenyl}sulfone (referred to as "BAPS-M" hereinafter) was dissolved in N,N-dimethylformamide (referred to as "DMF" hereinafter) in a nitrogen atmosphere. The resultant solution was stirred under cooling with ice-water, and then one equivalent of 4,4'-(4,4'-isopropylidenediphenoxy) bis(phthalic anhydride) (referred to as "BPADA" hereinafter) was dissolved in the solution to obtain a polyamic acid polymer solution having a solid content of 30% by weight.

EXAMPLE 44

The polyamic acid polymer solution prepared by Preparation T was heated under a reduced pressure of 665 Pa at 200° C. for 3 hours to obtain a solid thermoplastic polyimide resin. The resultant thermoplastic polyimide resin, a novolac epoxy resin (Epicoat 1032H60: manufactured by Yuka-Shell Company), and 4,4'-diaminodiphenylsulfone (referred to as "4,4'-DDS" hereinafter) were mixed at a weight ratio of 90/10/3. Then, the resultant mixture was dissolved in dioxolane so that the solid content was 20% by weight, to obtain a polyimide resin composition solution (a).

On the other hand, the resultant thermoplastic polyimide resin, a novolac epoxy resin (Epicoat 1032H60: manufactured by Yuka-Shell Company), and 4,4'-diaminodiphenylsulfone (referred to as "4,4'-DDS" hereinafter) were mixed at a weight ratio of 50/50/15. Then, the resultant mixture was dissolved in dioxolan so that the solid content was 30% by weight, to obtain a polyimide resin composition solution (a2).

The resulting solution was applied to a polyethylene terephthalate film of 125 µm in thickness used as a support so that the dry thickness was 25 µm, and then dried at 60° C. for 2 minutes and at 170° C. for 5 minutes. Then, the coated film was removed from the polyethylene terephthalate film to form an adhesive sheet (x).

The resulting polyimide resin composition solution (a) was applied to one of the surfaces of the non-thermoplastic polyimide film A of 25 µm in thickness so that the dry thickness was 4 µm, and then dried at 60° C. for 2 minutes and at 170° C. for 5 minutes to obtain a laminate. The adhesive sheet (x) was laminated on the resulting laminate so that the adhesive sheet (x) faced the polyimide film of the laminate, and then sandwiched between two copper foil roughened surfaces (rolled copper foils; BHY-22B-T manufactured by Japan Energy Co., Ltd., Rz=1.97 µm), followed by curing using a vacuum press under the conditions including a temperature of 200° C., a heat plate pressure of 1 MPa, a pressing time of 1 hour, and a vacuum condition of 1 kPa. As a result, a cured laminate was obtained. After the rolled copper foil on the layer (a) of the laminate was etched with a ferric chloride etchant, the adhesive strength between the roughened surface and an electroless-plated copper layer to the layer (a) was 8 N/cm. Also, the volume resistivity was $2.0 \times 10^{16}$ Ω·cm, the relative dielectric constant was 3.0, and the dielectric loss tangent was 0.011. These dielectric properties were evaluated in a range of 1 to 10 GHz by a cavity resonator perturbation method using a complex dielectric constant evaluation apparatus manufactured by KEAD Co., Ltd. The adhesive strength to the electroless plated copper was measured as follows: First, electroless copper plating was performed after etching of the rolled copper foil. The electroless-plated layer was formed to a thickness of 300 nm by the same method as shown in Table 1. Then, an electrolytic plated copper layer was formed on the electroless-plated copper layer using a copper sulfate plating solution. The electrolytic copper plating was performed by pre-washing in 10% sulfuric acid for 30 seconds, and then plating at room temperature for 40 minutes. The current density was 2 A/dm², and the thickness of the film was 20 µm. The plated copper layer was etched through a mask to form a conductor layer with a width of 3 mm. The adhesive strength (peeling angle of 180°) of the conductor layer to the layer (a) was measured according to JIS C6481.

(2) An inner circuit board was prepared from a glass epoxy copper-clad laminate comprising a copper foil of 9 µm in thickness was formed. Then, the circuit surface of the circuit board, the layer (x), the laminate comprising the non-thermoplastic polyimide film prepared in Preparation A and the layer (a), and a rolled copper foil (BHY-22B-T manufactured by Japan Energy Co., Ltd., Rz=1.97 µm) having a roughened surface thereon were laminated with a vacuum press under the conditions including a temperature of 200° C., a heat plate pressure of 1 MPa, a pressing time of 1 hour, and a vacuum condition of 1 kPa, and then cured. The lamination was performed so that the layer (a) of the laminate faced the rolled copper foil.

(3) The copper foil over the entire surface of the laminate obtained as described above (2) was etched with a ferric chloride etchant.

(4) Via holes of 30 μm in inner diameter were formed directly above an electrode of the inner board by a UV-YAG laser so as to extend to the electrode.

(5) Then, electroless copper plating was performed over the entire surface of the board by the following method: First, the laminate was cleaned with an alkali cleaner liquid and then pre-dipped in an acid for a short time. Furthermore, alkali reduction was performed in an alkali solution in the presence of a palladium catalyst. Then, chemical copper plating was performed in an alkali at room temperature for 10 minutes. In this method, an electroless copper plated layer having a thickness of 300 nm was formed.

(6) A liquid photosensitive plating resist (THB320P manufactured by Japan Synthetic Rubber Co., Ltd.) was coated and then dried at 110° C. for 10 minutes to form a resist layer of 20 μm in thickness. A glass mask with a L/S of 15 μm/15 μm was bonded to the resist layer and then exposed to light with an ultraviolet exposure device comprising a extra-high-voltage mercury vapor lamp for 1 minute. Then, development was performed by dipping in a developer (PD523AD manufactured by Japan Synthetic Rubber Co., Ltd.) for 3 minutes to remove the exposed portion to form a resist pattern with a L/S of 15 μm/15 μm.

(7) Then, a copper pattern of 10 μm in thickness was formed using a copper sulfate plating solution on the surface portion where the electroless-plated copper film was exposed. The electrolytic copper plating was performed by pre-washing in 10% sulfuric acid for 30 seconds, and then plating at room temperature for 20 minutes. The current density was 2 A/dm$^2$, and the thickness of the film was 10 μm.

(8) The plating resist was removed with acetone.

(9) The electroless-plated copper layer was removed from portions other than a circuit by dipping in a sulfuric acid/hydrogen peroxide etchant for 5 minutes to form a printed circuit board.

The resultant printed circuit board substantially had a designed L/S value and a satisfactory circuit shape. As a result of EPMA analytical measurement of a residual metal on a portion from which a feeding layer was removed, no residual metal was observed. In addition, the roughened surface of the polyimide resin composition layer had a Rz value of 1.0 μm, a Ra1 value of 0.13 μm, a Ra2 value of 0.23 μm, and a Ra1/Ra2 ratio of 0.57. Therefore, the circuit pattern was strongly bonded.

EXAMPLE 45

A cured laminate and a printed circuit board were produced by the same method as in Example 44 except that 1,3-bis(3-aminophenoxy)benzene (referred to as "APB" hereinafter) was used instead of BAPS-M used in Preparation T to form a polyimide resin composition solution (b). In the cured laminate, adhesive strength to an electroless-plated copper layer was 7 N/cm. Also, the volume resistivity was $1.7 \times 10^{16}$ Ω·cm, the relative dielectric constant was 3.0, and the dielectric loss tangent was 0.010. The resultant printed circuit board had substantially a designed L/S value and a satisfactory circuit shape. As a result of EPMA analytical measurement of a residual metal on a portion from which a feeding layer was removed, no residual metal was observed. In addition, the roughened surface of the polyimide resin composition layer had a Rz value of 1.1 μm, a Ra1 value of 0.15 μm, a Ra2 value of 0.24 μm, and a Ra1/Ra2 ratio of 0.63. Therefore, the circuit pattern was strongly bonded.

EXAMPLE 46

A cured laminate and a printed circuit board were produced by the same method as in Example 44 except that 0.95 equivalent of APB and 0.05 equivalent of 3,3'-dihydroxy-4,4'diaminobiphenyl were used instead of one equivalent of BAPS-M used in Preparation T to form a polyimide resin composition solution (c). In the cured laminate, adhesive strength to an electroless-plated copper layer was 8 N/cm. Also, the volume resistivity was $1.9 \times 10^{16}$ Ω·cm, the relative dielectric constant was 3.1, and the dielectric loss tangent was 0.010. The resultant printed circuit board had substantially a designed L/S value and a satisfactory circuit shape. As a result of EPMA analytical measurement of a residual metal on a portion from which a feeding layer was removed, no residual metal was observed. In addition, the roughened surface of the polyimide resin composition layer had a Rz value of 1.1 μm, a Ra1 value of 0.15 μm, a Ra2 value of 0.23 μm, and a Ra1/Ra2 ratio of 0.65. Therefore, the circuit pattern was strongly bonded.

EXAMPLE 47

A cured laminate and a printed circuit board were produced by the same method as in Example 44 except that in Preparation T, the polyimide resin composition solution (a) was applied to both surfaces of the polyimide film so that the dry thickness of each layer was 4 μm. In the cured laminate, adhesive strength to an electroless-plated copper layer was 8 N/cm. Also, the volume resistivity was $2.1 \times 10^{16}$ Ω·cm, the relative dielectric constant was 3.0, and the dielectric loss tangent was 0.011. The resultant printed circuit board had substantially a designed L/S value and a satisfactory circuit shape. As a result of EPMA analytical measurement of a residual metal on a portion from which a feeding layer was removed, no residual metal was observed. In addition, the roughened surface of the polyimide resin composition layer had a Rz value of 1.0 μm, a Ra1 value of 0.13 μm, a Ra2 value of 0.24 μm, and a Ra1/Ra2 ratio of 0.54. Therefore, the circuit pattern was strongly bonded.

EXAMPLE 48

The polyimide resin composition solution (a2) prepared using the polyamic acid polymer solution in Preparation T was applied to a surface of a laminate comprising the non-thermoplastic polyimide resin film A (referred to as "layer A" hereinafter) and the layer (a) so that the surface was opposite to the layer (a) and the dry thickness was 25 μm, and then dried at 60° C. for 2 minutes and at 170° C. for 5 minutes to form a layer (s). As a result, a laminate comprising the layer (s), the layer (A), and the layer (a) was obtained.

A cured laminate was produced by the same method as in Preparation T except that the resultant laminate was sandwiched between the roughened surfaces of two copper foils (rolled copper foil BHY-22B-T manufactured by Japan Energy Co., Ltd., Rz=1.97 μm). In addition, a printed circuit board was produced by the same method as in Example 44(2) except that a circuit surface of an inner circuit board, the laminate comprising the layer (s) and the non-thermoplastic polyimide film prepared in Preparation A, and the layer (a), and a rolled copper foil (BHY-22B-T manufactured by Japan Energy Co., Ltd., Rz=1.97 μm) with a roughened surface were laminated so that the roughened surface faced the laminate. In the cured laminate, adhesive strength to an electroless-plated copper layer was 8 N/cm. Also, the volume resistivity was $2.0 \times 10^{16}$ Ω·cm, the relative dielectric constant was 3.0, and the dielectric loss tangent was 0.011. The resultant printed circuit board had substantially a designed L/S value and a satisfactory circuit shape. As a result of EPMA analytical measurement of a residual metal on a portion from which a feeding layer was removed, no residual metal was observed. In addition, the roughened surface of the polyimide resin composition layer had a Rz value of 1.0 μm, a Ra1 value of 0.14 μm, a Ra2 value of 0.23 μm, and a Ra1/Ra2 ratio of 0.61. Therefore, the circuit pattern was strongly bonded.

EXAMPLE 49

A cured laminate and a printed circuit board were produced by the same method as in Example 44 except that in Preparation T, the thermoplastic polyimide resin was mixed with an oligomer BA200 (trade name, manufactured by Lonza Inc.) of cyanate ester PRIMASET BADCY (trade name, manufactured by Lonza Inc.) and zinc (II) acetylacetonate were mixed at a weight ratio of 90/10/0.004 instead of being mixed with novolac epoxy resin (Epicoat 1032H60: manufactured by Yuka-Shell Company) and 4,4'-diaminodiphenylsulfone (referred to as "4,4'-DDS" hereinafter) at a weight ratio of 90/10/3, to form a polyimide resin composition solution (d). In the cured laminate, adhesive strength to an electroless-plated copper layer was 7 N/cm. Also, the volume resistivity was $2.0 \times 10^{16}$ Ω·cm, the relative dielectric constant was 2.9, and the dielectric loss tangent was 0.009. The resultant printed circuit board had substantially a designed L/S value and a satisfactory circuit shape. As a result of EPMA analytical measurement of a residual metal on a portion from which a feeding layer was removed, no residual metal was observed. In addition, the roughened surface of the polyimide resin composition layer had a Rz value of 0.9 μm, a Ra1 value of 0.12 μm, a Ra2 value of 0.21 μm, and a Ra1/Ra2 ratio of 0.57. Therefore, the circuit pattern was strongly bonded.

EXAMPLE 50

A cured laminate and a printed circuit board were produced by the same method as in Example 44 except that the polyimide resin composition solution (a) was applied to one of the surfaces of the non-thermoplastic polyimide film of 12.5 μm in thickness prepared in Preparation A so that the dry thickness of each layer was 1 μm instead of being applied on one of the surfaces of the non-thermoplastic polyimide film of 25 μm in thickness so that the dry thickness was 4 μm. In the cured laminate, adhesive strength to an electroless-plated copper layer was 7 N/cm. Also, the volume resistivity was $1.8 \times 10^{16}$ Ω·cm, the relative dielectric constant was 3.0, and the dielectric loss tangent was 0.011. The resultant printed circuit board had substantially a designed L/S value and a satisfactory circuit shape. As a result of EPMA analytical measurement of a residual metal on a portion from which a feeding layer was removed, no residual metal was observed. In addition, the roughened surface of the polyimide resin composition layer had a Rz value of 1.0 μm, a Ra1 value of 0.13 μm, a Ra2 value of 0.23 μm, and a Ra1/Ra2 ratio of 0.57. Therefore, the circuit pattern was strongly bonded.

EXAMPLE 51

A cured laminate and a printed circuit board were produced by the same method as in Example 44 except that a build-up substrate epoxy resin sheet (y) of 25 μm in thickness was used instead of the adhesive sheet (x) of 25 μm in thickness. In the cured laminate, adhesive strength to an electroless-plated copper layer was 8 N/cm. Also, the volume resistivity was $1.5 \times 10^{15}$ Ω·cm, the relative dielectric constant was 3.2, and the dielectric loss tangent was 0.014. The resultant printed circuit board had substantially a designed L/S value and a satisfactory circuit shape. As a result of EPMA analytical measurement of a residual metal on a portion from which a feeding layer was removed, no residual metal was observed. In addition, the roughened surface of the polyimide resin composition layer had a Rz value of 1.0 μm, a Ra1 value of 0.14 μm, a Ra2 value of 0.24 μm, and a Ra1/Ra2 ratio of 0.58. Therefore, the circuit pattern was strongly bonded.

COMPARATIVE EXAMPLE 6

An inner circuit board was produced using a glass epoxy copper-clad laminate comprising a copper foil of 9 μm in thickness, and then the build-up substrate epoxy resin sheet (y) of 50 μm in thickness was laminated on the circuit board, followed by curing at 170° C. for 30 minutes. Next, the resulting insulating board was dipped in a potassium permanganate solution for 10 minutes to roughen the surface of the resin layer, for improving adhesiveness to an electroless-plated film. Next, a cured laminate and a printed circuit board were produced by the same procedures as in Example 44(4) and the subsequent steps. In the cured laminate, adhesive strength to an electroless-plated copper layer was 7 N/cm. Also, the volume resistivity was $4.0 \times 10^{13}$ Ω·cm, the relative dielectric constant was 3.5, and the dielectric loss tangent was 0.040. In addition, the roughened surface of the polyimide resin composition layer had a Rz value of 3.5 μm, a Ra1 value of 0.19 μm, a Ra2 value of 0.58 μm, and a Ra1/Ra2 ratio of 0.33. Although the circuit pattern was strongly bonded, the circuit width varied because of the large irregularity on the resin surface of the resultant printed circuit board. Also, as a result of EPMA analytical measurement of a residual metal on a portion from which a feeding layer was removed, copper was observed.

COMPARATIVE EXAMPLE 7

An inner circuit board was produced using a glass epoxy copper-clad laminate comprising a copper foil of 9 μm in thickness, and then the build-up substrate epoxy resin sheet (z) of 45 μm in thickness was laminated on the circuit board, followed by curing at 160° C. for 60 minutes. Next, the resulting insulating board was dipped in a potassium permanganate solution for 2 minutes to roughen the surface of the resin layer, for improving adhesiveness to an electroless-plated film. Next, a cured laminate and a printed circuit board were produced by the same procedures as in Example 44(4) and the subsequent steps. In the cured laminate, adhesive strength to an electroless-plated copper layer was 2 N/cm. Also, the volume resistivity was $5.0 \times 10^{13}$ Ω·cm, the relative dielectric constant was 3.7, and the dielectric loss tangent was 0.042. The resultant printed circuit board had substantially a designed L/S value and a satisfactory circuit shape. As a result of EPMA analytical measurement of a residual metal on a portion from which a feeding layer was removed, no residual metal was observed. However, the circuit pattern on the printed circuit board was easily removed. The roughened surface of the polyimide resin composition layer had a Rz value of 1.2 μm, a Ra1 value of 0.04 μm, a Ra2 value of 0.18 μm, and a Ra1/Ra2 ratio of 0.22.

REFERENCE EXAMPLE 1

The polyimide resin composition solution (a) was applied to a thickness on a polyethylene terephthalate film of 125 μm in thickness used as a support so that the dry thickness was 50 µm, and then dried at 80° C. for 2 minutes, at 120° C. for 2 minutes, and at 170° C. for 2 minutes to obtain a polyimide resin sheet. The support was separated from the sheet to obtain a single-layer sheet, and the sheet was sandwiched between the roughened surfaces of two copper foils (rolled copper foil; BHY-22B-T manufactured by Japan Energy Co., Ltd., Rz=1.97 µm). Then, curing was performed by a vacuum press under the conditions including a temperature of 200° C., a heat plate pressure of 3 MPa, a pressing time of 1 hour, and a vacuum condition of 1 kPa to obtain a cured laminated. After etching of the rolled copper foil, adhesive strength of the roughened surface of the layer (a) to an electroless-plated copper layer was 8 N/cm. Also, the volume resistivity was $1.7 \times 10^{16}$ Ω·cm, the relative dielectric constant was 3.1, and the dielectric loss tangent was 0.012. Then, a printed circuit board was produced by the same operation as in Example 44(2) except that a circuit plane of an inner circuit board, the single layer sheet, and a rolled copper foil (BHY-22B-T manufactured by Japan Energy Co., Ltd., Rz=1.97 µm) with a roughened surface were laminated so that the roughened surface faced the sheet, and cured by a vacuum press under the conditions including a temperature of 200° C., a heat plate pressure of 3 MPa, a pressing time of 1 hour, and a vacuum condition of 1 kPa. The resultant printed circuit board had substantially a designed L/S value and a satisfactory circuit shape. As a result of EPMA analytical measurement of a residual metal on a portion from which a feeding layer was removed, no residual metal was observed. Furthermore, the roughened surface of the polyimide resin composition layer had a Rz value of 1.0 µm, a Ra1 value of 0.14 µm, a Ra2 value of 0.24 µm, and a Ra1/Ra2 ratio of 0.58, and the circuit was strongly bonded.

TABLE 6

| example | Polyimide resin compositin solution | Polymer film | Adhesive | Compositin of formed laminate | Compositin of cured laminate | Thickness of each compositin of cured laminate |
|---|---|---|---|---|---|---|
| 44 | (a) | A | (x) | layer(a)/A | layer(a)/A/(x) | 4 µm/25 µm/25 µm |
| 45 | (b) | A | (x) | layer(b)/A | layer(b)/A/(x) | 4 µm/25 µm/25 µm |
| 46 | (c) | A | (x) | layer(c)/A | layer(c)/A/(x) | 4 µm/25 µm/25 µm |
| 47 | (a) | A | (x) | layer(a)/A/layer(a) | layer(a)/A/layer(a)/(x) | 4 µm/25 µm/4 µm/25 µm |
| 48 | (a) | A | • | layer(a)/A/layer(s) | layer(a)/A/layer(s) | 4 µm/25 µm/25 µm |
| 49 | (d) | A | (x) | layer(d)/A | layer(d)/A/(x) | 4 µm/25 µm/25 µm |
| 50 | (a) | A | (x) | layer(a)/A | layer(a)/A/(x) | 1 µm/12.5 µm/25 µm |
| 51 | (a) | A | (y) | layer(a)/A | layer(a)/A/(y) | 4 µm/25 µm/25 µm |
| Comparative Example 6 | • | • | (y) | • | (y) | 50 µm |
| Comparative Example 7 | • | • | (z) | • | (z) | 45 µm |
| Reference Example 1 | (a) | • | • | • | (a) | 50 µm |

TABLE 7

| | Cured laminate | | | Printed circuit board | | | |
|---|---|---|---|---|---|---|---|
| example | Peel strength to non-electroless coated steel (N/cm) | Relative dielectric constant/dielectric loss tangent | Volume resistvity (Ω·cm) | Surface Roughness (µm) | Adhesiveness to circuit board | Residual metal | Shape of circuit |
| 44 | 8 | 3.0/0.011 | $2.0 \times 10^{16}$ | 1.0 | Good | None | Good |
| 45 | 7 | 3.0/0.010 | $1.7 \times 10^{16}$ | 1.1 | Good | None | Good |
| 46 | 8 | 3.1/0.010 | $1.9 \times 10^{16}$ | 1.1 | Good | None | Good |
| 47 | 8 | 3.0/0.011 | $2.1 \times 10^{16}$ | 1.0 | Good | None | Good |
| 48 | 8 | 3.0/0.011 | $2.0 \times 10^{16}$ | 1.0 | Good | None | Good |
| 49 | 7 | 2.9/0.009 | $2.0 \times 10^{16}$ | 0.9 | Good | None | Good |
| 50 | 7 | 3.0/0.011 | $1.8 \times 10^{16}$ | 1.0 | Good | None | Good |
| 51 | 8 | 3.2/0.014 | $1.5 \times 10^{15}$ | 1.0 | Good | None | Good |
| Comparative Example 6 | 7 | 3.5/0.040 | $4.0 \times 10^{13}$ | 3.5 | Good | Residue | No good |
| Comparative Example 7 | 2 | 3.7/0.042 | $5.0 \times 10^{13}$ | 1.2 | No good | None | No good |
| Reference Example 1 | 8 | 3.1/0.012 | $1.7 \times 10^{16}$ | 1.0 | Good | None | Good |

EXAMPLE 52

A roughened surface (Ra2=0.28 μm) of a rolled copper foil BHY-22B-T (18 μm, manufactured by Japan Energy Co., Ltd.) was placed on a thermoplastic polyimide layer of a laminate comprising the polyimide film C of 25 μm in thickness and the thermoplastic polyimide resin layer Z, and laminated by a heat roll under the conditions including a temperature of 310° C., a linear pressure of 20 kgf, and a processing velocity of 1.5 m/min. The laminated copper foil was completely removed with a hydrochloric acid/ferric chloride etchant to obtain a resin surface roughened with the copper foil. Next, the roughened resin surface was treated with a surface treatment agent (referred to as a "desmearing liquid") comprising a permanganate under the same conditions as shown in Table 2 except that the treatment time of each of swelling, microetching, and neutralization was changed from 2 minutes to 5 minutes, to obtain a laminate comprising a surface-roughened thermoplastic polyimide resin film according to the present invention. The surface shape of the resulting laminate was observed. The results are shown in Table 7.

Then, electroless copper plating and electrolytic copper plating were performed on the roughened surface to form a copper layer of 18 μm in thickness, and adhesiveness at room temperature was measured. The results are shown in Table 3.

Furthermore, a resist pattern was formed on the copper plated layer, and the exposed portion of the plated copper layer was removed with a hydrochloric acid/ferric chloride etchant to form wiring with a L/S of 10 μm/10 μm. The thus-formed wiring was observed through an optical microscope to measure the circuit shape and the presence of etching residue of copper. The results are shown in Table 3.

(Preparation S of Thermoplastic Polyimide Laminate)

In DMF, 1,3-bis(3-aminophenoxy)benzene and 3,3'-dihydroxybenzidine dissolved at a molar ratio of 4:1, and 4,4'-(4,4'-isopropylidenediphenoxy) bis(phthalic anhydride) was added under stirring so that the acid dianhydride and the diamine became equimolar. The resultant mixture was stirred for about 1 hour to prepare a polyamic acid DMF solution with a solid content of 20% by weight.

The resultant DMF solution of polyamic acid, which is a precursor of thermoplastic polyimide, was applied to one of the surfaces of the non-thermoplastic polyimide film A by a gravure coater, the polyimide film A being prepared in Preparation A and used as a core film.

After the application, heating treatment was performed at a final heating temperature of 390° C. to remove the solvent or imidize the polyamic acid, thereby producing a laminated polyimide film comprising a non-thermoplastic polyimide layer and a thermoplastic polyimide layer. The thickness of the thermoplastic polyimide layer was adjusted by controlling the coating amount so as to be 4 μm after drying imidization. The measured glass transition temperature of the single sheet of the thermoplastic polyimide resin was 180° C.

EXAMPLE 53

A surface of the thermoplastic polyimide layer of the laminate prepared in Preparation S was treated with a desmearing liquid to obtain a laminate comprising a surface-roughened thermoplastic polyimide resin film according to the present invention. The treatment with the desmearing liquid was carried out by the same method as in Example 1 except that the treatment time in each step was changed to 5 minutes.

Then, surface analysis, formation of a plated copper layer, formation of micro-wiring, and evaluation of circuit formability, adhesiveness, and etching residue of the metal used were conducted by the same methods as in Example 52.

EXAMPLE 54

A roughened surface (Ra2=0.59 μm) of a rolled copper foil F2-WS (12 μm, manufactured by Furukawa Electric Co., Ltd.) was placed on the thermoplastic polyimide layer of the laminate prepared by the above-described method, and laminated by a heat roll under the conditions including a temperature of 310° C., a linear pressure of 20 kgf, and a processing velocity of 1.5 m/min. The laminated copper foil was completely removed with a hydrochloric acid/ferric chloride etchant to obtain a resin surface roughened with the copper foil. The observed surface shape of the resulting resin surface was as shown in Table 3. Then, surface analysis, formation of a plated copper layer, formation of micro-wiring, and evaluation of circuit formability, adhesiveness, and etching residue of the metal used were conducted by the same methods as in Example 52.

EXAMPLE 55

Surface analysis, formation of a plated copper layer, formation of micro-wiring, and evaluation of circuit formability, adhesiveness, and etching residue of the metal used were conducted by the same methods as in Example 52 except that a roughened surface (Ra2=0.28 μm) of a copper foil TQ-VLP (9 μm, manufactured by Mitsui Mining and Smelting Company) was used.

EXAMPLE 56

The surface of the thermoplastic polyimide layer of the laminate prepared by the above-described method was embossed by an embossing roll (made of stainless with Ra2 = 0.72 μm, backup roll: hardness SHEER D-78) at a temperature of 220° C., a linear pressure of 100 kgf/cm, and a processing velocity of 2 m/min. The resulting roughened surface was treated with a desmearing liquid to obtain a laminate having a surface-roughened thermoplastic polyimide resin film according to the present invention. The treatment with the desmearing liquid was carried out by the same method as in Example 52 except that the treatment time in each step was changed to 5 minutes.

Then, surface analysis, formation of a plated copper layer, formation of micro-wiring, and evaluation of circuit formability, adhesiveness, and etching residue of the metal used were conducted by the same methods as in Example 52.

EXAMPLE 57

The surface of the thermoplastic polyimide layer of the laminate prepared by the above-described method was polished (pressure current 1.50 to 1.75 A, buff: Ra2=17 μm). The resulting roughened surface as treated with a desmearing liquid to obtain a laminate having a surface-roughened thermoplastic polyimide resin film according to the present invention. The treatment with the desmearing liquid was carried out by the same method as in Example 52.

Then, surface analysis, formation of a plated copper layer, formation of micro-wiring, and evaluation of circuit formability, adhesiveness, and etching residue of the metal used were conducted by the same methods as in Example 52. The results are shown in Table 8.

TABLE 8

| Example | Ra1 (μm) | Ra2 (μm) | Ra1/Ra2 | Circuit formability(✗) Metal | Circuit formability(✗) Circuit | Adhesiveness (N/cm) |
|---|---|---|---|---|---|---|
| 52 | 0.14 | 0.23 | 0.61 | None | Good | 12 |
| 53 | 0.06 | 0.07 | 0.85 | None | Good | 8 |
| 54 | 0.27 | 0.39 | 0.69 | None | Good | 11 |
| 55 | 0.19 | 0.29 | 0.66 | None | Good | 9 |
| 56 | 0.11 | 0.20 | 0.55 | None | Good | 8 |
| 57 | 0.71 | 1.20 | 0.59 | None | Good | 12 |

(✗)Circuit formability
Circuit: Good means the pitch of edges in any part of circuit is between 9 μm and 11 μm, and it means no good that the pitch become not more than 9 μm or not less than 11 μm.
Metal: None means no copper signal is observed as good result, Copper signal means metal residue as bad result.

INDUSTRIAL APPLICABILITY

A thermoplastic polyimide resin film and laminate of the present invention permit formation of micro-wiring with low L/S, for example, a L/S of 30 μm/30 μm or less, and can be suitably used for manufacturing circuit boards with excellent adhesiveness and heat resistance, such as a flexible printed circuit board (FPC) and a build-up circuit board. A method for manufacturing a circuit board of the present invention is capable of satisfactorily forming a microcircuit pattern on a resin composition surface according to the present invention even under lamination conditions such as a relatively low pressure. Also, the method can provide a printed circuit board with high adhesive strength.

The invention claimed is:

1. A resin film comprising a thermoplastic polyimide resin having a surface shape formed on at least one of the surfaces thereof, the surface shape having a Ra1 value of arithmetic mean roughness of 0.05 μm to 1 μm measured with a cutoff value of 0.002 mm, and a Ra1/Ra2 ratio of 0.4 to 1, Ra2 being a value measured with a cutoff value of 0.1 mm.

2. The resin film according to claim 1, comprising a polyimide resin.

3. A laminate comprising at least one layer of the resin film according to claim 1.

4. The laminate according to claim 1 further comprising a metal layer provided on the surface having the surface shape.

* * * * *